US012707792B2

(12) United States Patent
Lee et al.

(10) Patent No.: US 12,707,792 B2
(45) Date of Patent: Aug. 11, 2026

(54) DISPLAY DEVICE HAVING LIGHT EMITTING ELEMENT LAYER BETWEEN SUBSTRATE AND WAVELENGTH CONTROL LAYER

(71) Applicant: Samsung Display Co., LTD., Yongin-si (KR)

(72) Inventors: Seung Kyu Lee, Hwaseong-si (KR); Won Tae Kim, Suwon-si (KR); Hoon Kim, Suwon-si (KR); Yong Sik Hwang, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 1074 days.

(21) Appl. No.: 17/837,708

(22) Filed: Jun. 10, 2022

(65) Prior Publication Data

US 2023/0030535 A1 Feb. 2, 2023

(30) Foreign Application Priority Data

Jul. 27, 2021 (KR) ........................ 10-2021-0098434

(51) Int. Cl.
*H10H 20/80* (2025.01)
*H10H 20/821* (2025.01)
(Continued)

(52) U.S. Cl.
CPC ........ *H10H 29/142* (2025.01); *H10H 20/821* (2025.01); *H10H 20/84* (2025.01);
(Continued)

(58) Field of Classification Search
CPC ............................ H10H 20/84; H10H 20/882
See application file for complete search history.

(56) References Cited

U.S. PATENT DOCUMENTS 11,855,053 B2 12/2023 Kong et al.
11,983,350 B2 5/2024 Kang et al.
(Continued)

FOREIGN PATENT DOCUMENTS

KR 10-2016-0084557 7/2016
KR 10-2019-0110660 10/2019
(Continued)

OTHER PUBLICATIONS

Korean Notice of Allowance issued in corresponding KR Application No. 10-2021-0098434, dated May 31, 2025, 2 pages.

*Primary Examiner* — Anh D Mai
(74) *Attorney, Agent, or Firm* — Womble Bond Dickinson (US) LLP

(57) ABSTRACT

A display device comprises sub-pixels, a bank disposed on a substrate and disposed at a boundary between the sub-pixels, a wavelength control layer including wavelength conversion layers disposed in a region surrounded by the bank and a light transmitting layer disposed in the sub-pixels, a color filter layer disposed on the wavelength control layer, and light emitting element layers disposed between the substrate and the wavelength control layer, the light emitting layers including a light emitting element disposed in one of the sub-pixels, and connection electrodes connected to ends of the light emitting element. Each of the wavelength conversion layers contacts at least one of the connection electrodes.

10 Claims, 15 Drawing Sheets

(51) Int. Cl.

| | |
|---|---|
| ***H10H 20/84*** | (2025.01) |
| ***H10H 20/851*** | (2025.01) |
| ***H10H 20/855*** | (2025.01) |
| ***H10H 29/14*** | (2025.01) |

(52) U.S. Cl.
CPC ...... *H10H 20/8514* (2025.01); *H10H 20/855* (2025.01); *H10H 20/882* (2025.01)

(56) References Cited

U.S. PATENT DOCUMENTS

| | | | |
|---|---|---|---|
| 12,289,975 B2 | 4/2025 | Kong et al. | |
| 2017/0133357 A1* | 5/2017 | Kuo | H10H 20/855 |
| 2019/0378873 A1* | 12/2019 | Lee | H10H 20/8514 |
| 2020/0091464 A1* | 3/2020 | Park | H10K 50/13 |
| 2021/0185776 A1* | 6/2021 | Lin | B41F 15/34 |
| 2021/0217739 A1 | 7/2021 | Lee et al. | |

FOREIGN PATENT DOCUMENTS

| | | |
|---|---|---|
| KR | 10-2020-0001649 A | 1/2020 |
| KR | 10-2020-0100903 | 8/2020 |
| KR | 10-2021-0005453 A | 1/2021 |
| KR | 10-2021-0030538 | 3/2021 |
| KR | 10-2541260 B1 | 6/2023 |
| KR | 10-2652645 B1 | 4/2024 |

* cited by examiner

10
SPX1
SPX2
SPX3
NEA
EMA
NEA
EMA
NEA
EMA
NEA
WCL1
WCL2
TPL
CF1
WCP1
BRS1
SCP
CF2
WCP2
BRS2
SCP
CF3
BRS3
SCP
ENL
CPL2
BK2
CPL1
BK1
CPL3
BNL
PAS1
VIA
IL
GI
BL
SUB
PAS3
CNE1
PAS2
CNE2
BNL
PAS1
BP
BP
RME1
ED
RME2
DR3
DR1
DR2
RME: RME1, RME2
CNE: CNE1, CNE2
PX: SPX1, SPX2, SPX3
CF: CF1, CF2, CF3
CWL: WCL1, WCL2, WCL3
CFL: CF1, CF2, CF3, BK1, BK2

10
SPX1
SPX2
SPX3
NEA
EMA
ENL
CPL2
OC
BK1
CPL1
BNL
PAS1
VIA
IL
GI
BL
SUB
TPL
SCP
BRS3
CF3
WCL2
BRS2
WCP2
CF2
WCL1
BRS1
WCP1
CF1
CNE1
CNE2
PAS2
PAS3
BP
ED
RME1
RME2
DR1
DR2
DR3
RME: RME1, RME2
CNE: CNE1, CNE2
PX: SPX1, SPX2, SPX3
CF: CF1, CF2, CF3
CWL: WCL1, WCL2, WCL3
CFL: CF1, CF2, CF3, BK1

DISPLAY DEVICE HAVING LIGHT EMITTING ELEMENT LAYER BETWEEN SUBSTRATE AND WAVELENGTH CONTROL LAYER

CROSS-REFERENCE TO RELATED APPLICATION(S)

This application claims priority to and benefits of Korean Patent Application No. 10-2021-0098434 under 35 U.S.C. § 119, filed on Jul. 27, 2021 in the Korean Intellectual Property Office, the entire contents of which are incorporated herein by reference.

BACKGROUND

1. Technical Field

The disclosure relates to a display device.

2. Description of the Related Art

The importance of display devices has steadily increased with the development of multimedia technology. In response to the increased importance, various types of display devices such as organic light emitting displays (OLED), liquid crystal displays (LCD) and the like have been used.

A display device is a device for displaying an image, and includes a display panel, such as an organic light emitting display panel or a liquid crystal display panel. The light emitting display panel may include light emitting elements, e.g., light emitting diodes (LED). Examples of light emitting diodes include organic light emitting diodes (OLED) using an organic material as a light emitting material and inorganic light emitting diodes using an inorganic material as a light emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device capable of preventing degradation of a wavelength control layer and a light emitting element from external moisture and oxygen, and also capable of preventing degradation of the wavelength control layer from the light of the light emitting element.

However, aspects of the disclosure are not restricted to the one set forth herein. The above and other aspects of the disclosure will become more apparent to one of ordinary skill in the art to which the disclosure pertains by referencing the detailed description of the disclosure given below.

According to an embodiment of the disclosure, the display device may comprise sub-pixels, a bank disposed on a substrate and disposed at a boundary between the sub-pixels, a wavelength control layer including wavelength conversion layers disposed in a region surrounded by the bank and a light transmitting layer disposed in the sub-pixels, a color filter layer disposed on the wavelength control layer, and light emitting element layers disposed between the substrate and the wavelength control layer, the light emitting element layers including a light emitting element, and connection electrodes connected to ends of the light emitting element. Each of the wavelength conversion layers may contact at least one of the connection electrodes.

In an embodiment, the sub-pixels may include a first sub-pixel, a second sub-pixel, and a third sub-pixel. The wavelength conversion layers include a first wavelength conversion layer disposed in the first sub-pixel, and a second wavelength conversion layer disposed in the second sub-pixel.

In an embodiment, the light transmitting layer may be disposed on the first wavelength conversion layer in the first sub-pixel. The light transmitting layer may be disposed on the second wavelength conversion layer in the second sub-pixel. The light transmitting layer may be disposed in third sub-pixel.

In an embodiment, the first wavelength conversion layer may contact at least one of the connection electrodes disposed in the first sub-pixel. The second wavelength conversion layer may contact at least one of the connection electrodes disposed in the second sub-pixel. The light transmitting layer may contact at least one of the connection electrodes disposed in the third sub-pixel.

In an embodiment, the color filter layer may include a first color filter disposed in the first sub-pixel, a second color filter disposed in the second sub-pixel, and a third color filter disposed in the third sub-pixel.

In an embodiment, a light emitted from the light emitting element disposed in the first sub-pixel may pass through the first wavelength conversion layer and the light transmitting layer and may be incident to the first color filter. A light emitted from the light emitting element disposed in the second sub-pixel may pass through the second wavelength conversion layer and the light transmitting layer and may be incident to the second color filter. A light emitted from the light emitting element disposed in the third sub-pixel may pass through the light transmitting layer and may be incident to the third color filter.

In an embodiment, the light emitting element disposed in each of the first sub-pixel, the second sub-pixel, and the third sub-pixel may emit a first color light. The light incident to the first color filter layer may be converted into a second color light in the first wavelength conversion layer. The light incident to the second color filter layer may be converted into a third color light in the second wavelength conversion layer. The light incident to the third color filter layer may be the first color light that may pass through the light transmitting layer.

In an embodiment, the color filter layer further may include a first light blocking member disposed between the first color filter and the second color filter and disposed between the second color filter and the third color filter. The first light blocking member may overlap the bank in a plan view.

In an embodiment, the light transmitting layer may overlap the bank in a plan view, and may have a top surface that is flat.

In an embodiment, the display device may further comprise a first capping layer disposed between the color filter layer and the light transmitting layer. The first capping layer may contact the top surface of the light transmitting layer.

In an embodiment, the display device may further comprise a second capping layer disposed on the color filter layer, and an encapsulation layer disposed on the second capping layer.

In an embodiment, the display device may further comprise a first capping layer disposed between the light transmitting layer and the color filter layer, a second capping layer disposed on the color filter layer, and a third capping layer disposed between the light transmitting layer and the first wavelength conversion layer and disposed between the light transmitting layer and the second wavelength conversion layer.

In an embodiment, at least a portion of the third capping layer may contact at least one of the connection electrodes disposed in the third sub-pixel. The color filter layer may include color filters, and a first light blocking member disposed between the color filters. The first light blocking member may be disposed between the light transmitting layer and the third capping layer, and may overlap the bank in a plan view.

In an embodiment, the color filter layer may further include a second light blocking member disposed between the color filters. The second light blocking member may be disposed between the first capping layer and the second capping layer, and may overlap the first light blocking member in a plan view.

In an embodiment, the display device may further comprise a light transmitting pattern disposed in the third sub-pixel between the third capping layer and the connection electrodes.

In an embodiment, the wavelength conversion layers may include a base resin, and a wavelength conversion material and a scatterer included in the base resin, and a scatterer. The light transmitting layer and the light transmitting pattern may include the base resin and the scatterer.

According to an embodiment of the disclosure, a display device may comprise sub-pixels, a bank disposed on a substrate and disposed at a boundary between the sub-pixels, a wavelength control layer including wavelength conversion layers disposed in a region surrounded by the bank and a first light transmitting layer disposed in the sub-pixels, a color filter layer disposed on the wavelength control layer, and light emitting element layers disposed between the substrate and the wavelength control layer, the light emitting layers including a light emitting element and connection electrically electrodes connected to ends of the light emitting element. The first light transmitting layer may be disposed between the wavelength conversion layers and the light emitting element layers. The first light transmitting layer contacts at least one of the connection electrodes.

In an embodiment, the display device may further comprise at least one capping layer disposed between the wavelength conversion layers and the first light transmitting layer and the color filter layer, and a second light transmitting layer disposed between the at least one capping layer and the color filter layer. The first light transmitting layer and the second light transmitting layer may be disposed entirely within the sub-pixels.

In an embodiment, the sub-pixels may include a first sub-pixel, a second sub-pixel, and a third sub-pixel. The wavelength conversion layers may include a first wavelength conversion layer disposed in the first sub-pixel and a second wavelength conversion layer disposed in the second sub-pixel. The at least one capping layer may overlap the first wavelength conversion layer, the second wavelength conversion layer, and the first light transmitting layer in a plan view. The at least one capping layer may contact the first wavelength conversion layer, the second wavelength conversion layer, and the first light transmitting layer.

In an embodiment, the color filter layer may include a first color filter disposed in the first sub-pixel, the first color filter overlapping the first wavelength conversion layer, the first light transmitting layer, and the second light transmitting layer in a plan view, a second color filter disposed in the second sub-pixel, the second color filter overlapping the second wavelength conversion layer, the first light transmitting layer, and the second light transmitting layer in a plan view, and a third color filter disposed in the third sub-pixel, the third color filter overlapping the first light transmitting layer and the second light transmitting layer in a plan view.

In the display device according to embodiments, by disposing a light transmitting layer covering wavelength conversion layers and a capping layer on the light transmitting layer, it is possible to prevent the wavelength conversion layers or light emitting elements from being degraded by external moisture or oxygen.

In addition, by disposing the light transmitting layer between the wavelength conversion layers and the light emitting elements, degradation of the wavelength conversion layers by the light of the light emitting elements can be reduced.

However, the effects of the disclosure are not limited to the aforementioned effects, and various other effects are included in the specification.

BRIEF DESCRIPTION OF THE DRAWINGS

The above and other aspects and features of the disclosure will become more apparent by describing in detail embodiments thereof with reference to the attached drawings, in which:

FIG. 4 is a schematic plan view showing a light emitting element layer disposed in a pixel of a display device according to an embodiment;

FIG. 9 is an enlarged schematic cross-sectional view illustrating another example of area Q of FIG. 6;

DETAILED DESCRIPTION OF THE EMBODIMENTS

Figure 1:
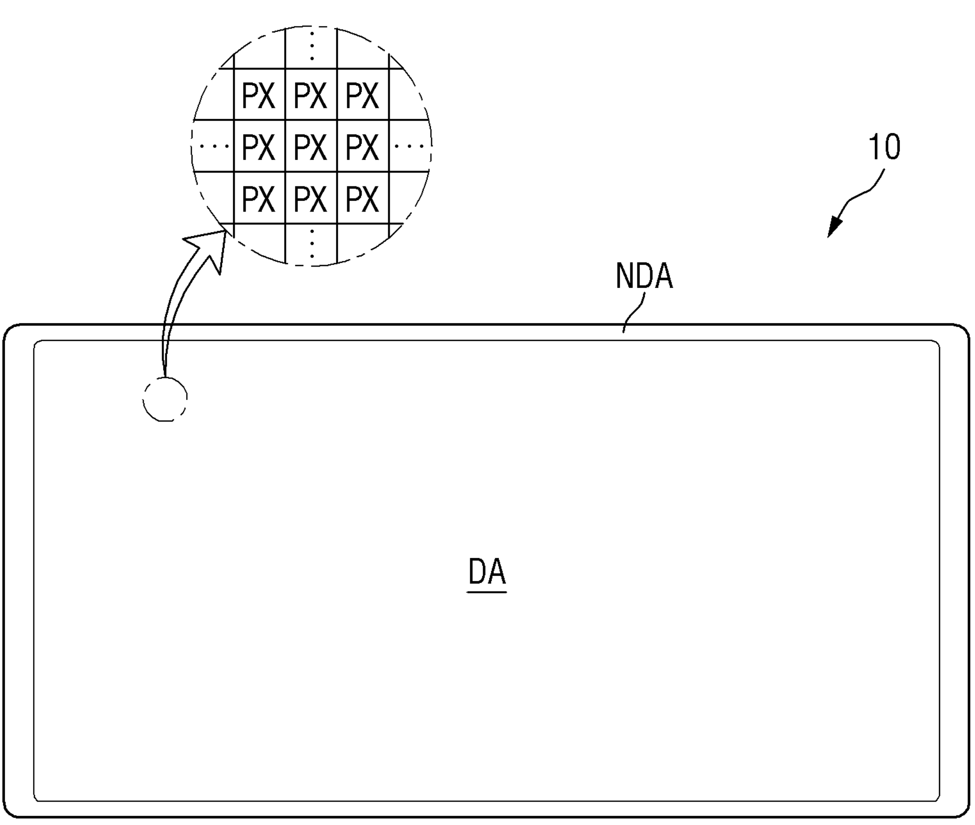
FIG. 1 is a plan view schematically illustrating a display device according to an embodiment.
Figure 1:
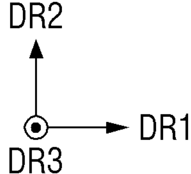

The disclosure will now be described more fully hereinafter with reference to the accompanying drawings, in which the embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the embodiments. Similarly, the second element could also be termed the first element.

Each of the features of the various embodiments of the disclosure may be combined or combined with each other, in part or in whole, and technically various interlocking and driving are possible. Each embodiment may be implemented independently of each other or may be implemented together in an association.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

Hereinafter, embodiments will be described in detail with reference to the accompanying drawings.

FIG. 1 is a plan view schematically illustrating a display device according to one embodiment.

Referring to FIG. 1, a display device 10 displays a moving image or a still image. The display device 10 may refer to any electronic device providing a display screen. Examples of the display device 10 may include a television, a laptop computer, a monitor, a billboard, an Internet-of-Things device, a mobile phone, a smartphone, a tablet personal computer (PC), an electronic watch, a smart watch, a watch phone, a head-mounted display, a mobile communication terminal, an electronic notebook, an electronic book, a portable multimedia player (PMP), a navigation device, a game machine, a digital camera, a camcorder and the like, which provide a display screen.

The display device 10 includes a display panel which provides a display screen. Examples of the display panel may include an inorganic light emitting diode display panel, an organic light emitting display panel, a quantum dot light emitting display panel, a plasma display panel and a field emission display panel. In the following description, an inorganic light emitting diode display panel is used as an example display panel, but the disclosure is not limited thereto, and other display panels may be applied within the same scope of technical spirit.

Hereinafter, a first direction DR1, a second direction DR2, and a third direction DR3 are defined in drawings of an embodiment describing the display device 10. The first direction DR1 and the second direction DR2 may be directions perpendicular to each other in a plane. The third direction DR3 may be a direction perpendicular to the plane on which the first direction DR1 and the second direction DR2 are located. The third direction DR3 is perpendicular to each of the first direction DR1 and the second direction DR2. In the embodiment describing the display device 10, the third direction DR3 indicates a thickness direction of the display device 10.

The display device 10 may have a rectangular shape including long and short sides such that the side in the first direction DR1 is longer than the side in the second direction DR2 in a plan view. A corner portion where the long side and the short side of the display device 10 meet may be right-angled in a plan view. However, the disclosure is not limited thereto, and it may be rounded to have a curved shape. The planar shape of the display device 10 is not limited to the illustrated example, and may be other shapes such as a square shape, a quadrilateral shape with rounded corners (vertices), other polygonal shapes and a circular shape.

A display surface of the display device 10 may be disposed on a side of the third direction DR3 which is the thickness direction. In embodiments describing the display device 10, unless otherwise noted, the term "upward" refers to a side of the third direction DR3, which is the display direction, and the term "top surface" refers to a surface toward the display direction. Further, the term "downward" refers to the other side of the third direction DR3, which is an opposite direction to the display direction, and the term "bottom surface" refers to a surface opposite the display direction. Furthermore, "left", "right", "upper" and "lower" indicate directions when the display device 10 is viewed from above. For example, "right side" indicates one side of the first direction DR1, "left side" indicates the other side of the first direction DR1, "upper side" indicates one side of the second direction DR2, and "lower side" indicates the other side of the second direction DR2.

The display device 10 may include a display area DA and a non-display area NDA. The display area DA is an area where a screen can be displayed, and the non-display area NDA is an area where a screen is not displayed.

The shape of the display area DA may be similar to the overall shape of the display device 10. For example, the display area DA may have a rectangular shape in a plan view. The display area DA may substantially occupy the center of the display device 10.

The display area DA may include pixels PX. The pixels PX may be arranged in a matrix. The shape of each pixel PX may be a rectangular or square shape in a plan view. However, the shape of each pixel PX is not limited thereto, and may be a rhombus shape in which each side is inclined with respect to a direction. The pixels PX may be alternately disposed in a stripe type or a PENTILE™ type.

The non-display area NDA may be disposed around the display area DA. The non-display area NDA may completely or partially surround the display area DA. In an embodiment, the display area DA may have a rectangular shape, and the non-display area NDA may be disposed adjacent to four sides of the display area DA. The non-display area NDA may form a bezel of the display device 10. In the non-display area NDA, wires and circuit drivers belonging to the display device 10, or pad portions on which an external device is mounted may be disposed.

Figure 2:
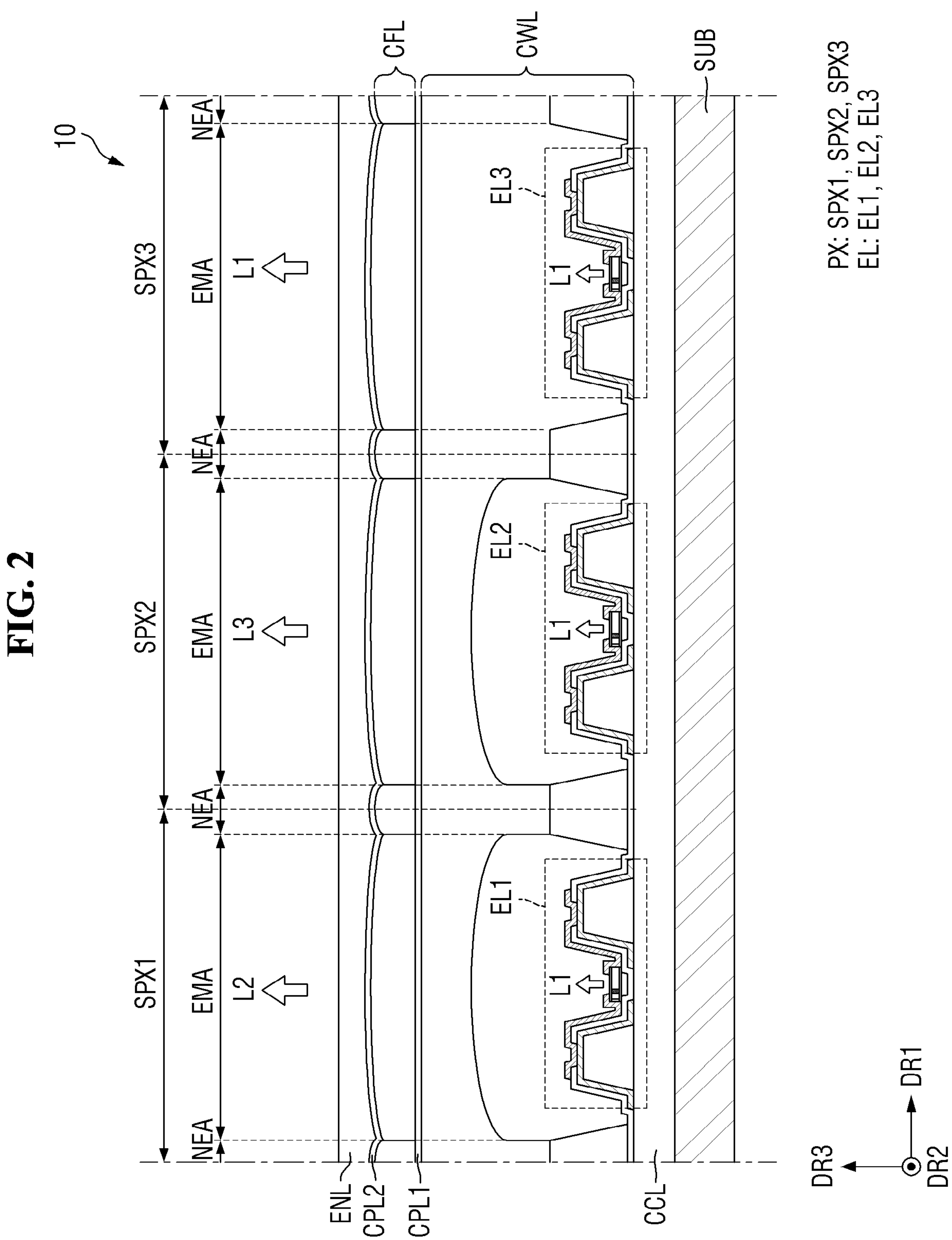
FIG. 2 is a schematic cross-sectional view of a display device according to an embodiment.

FIG. 2 is a schematic cross-sectional view of a display device according to an embodiment.

Referring to FIG. 2, each of the pixels PX may include sub-pixels SPXn (n being an integer of 1 to 3). For example, a pixel PX may include a first sub-pixel SPX1, a second sub-pixel SPX2, and a third sub-pixel SPX3. The first sub-pixel SPX1 may emit light of a first color, the second sub-pixel SPX2 may emit light of a second color, and the third sub-pixel SPX3 may emit light of a third color. The first color may be red, the second color may be green, and the third color may be blue. Although FIG. 2 illustrates that the pixel PX includes three sub-pixels SPXn, the disclosure is not limited thereto, and the pixel PX may include a larger number of sub-pixels SPXn.

Each sub-pixel SPXn of the display device 10 may include an emission area EMA and a non-emission area NEA. The emission area EMA may be an area in which a light emitting element layer EL is disposed and emits light of a wavelength band, and the non-emission area NEA may be an area in which the light emitting element layer EL is not disposed and from which no light is emitted because the aforementioned lights do not reach there.

The display device 10 may include a substrate SUB, and the light emitting element layer EL, a wavelength control layer CWL, and a color filter layer CFL disposed on the substrate SUB. The display device 10 may further include a circuit layer CCL disposed between the substrate SUB and the light emitting element layer EL, a first capping layer CPL1 disposed between the wavelength control layer CWL and the color filter layer CFL, and a second capping layer CPL2 and an encapsulation layer ENL disposed on the color filter layer CFL. On the substrate SUB, the circuit layer CCL, the light emitting element layer EL, the wavelength control layer CWL, the first capping layer CPL1, the color filter layer CFL, the second capping layer CPL2, and the encapsulation layer ENL may be disposed in sequence.

Banks BNL may be disposed at the boundaries between the sub-pixels SPXn, and the light emitting element layer EL may be disposed in each of the sub-pixels SPXn separated by the banks BNL. The light emitting element layer EL may be disposed between the circuit layer CCL and the wavelength control layer CWL disposed on the substrate SUB, and may include light emitting elements ED (refer to FIG. 4) to emit light of a selected wavelength band. The light may be incident to the color filter layer CFL through the wavelength control layer CWL.

The display device 10 according to an embodiment may be a front emission type display device in which light L is emitted in an upward direction of the substrate SUB on which the light emitting element layer EL is disposed. The light emitted from the light emitting element layer EL may travel in a downward direction of the substrate SUB, but may be reflected by a structure within the light emitting element layer EL or a structure of the circuit layer CCL to be emitted in the upward direction of the substrate SUB. The display device 10 may be a front emission type light emitting display device including only one substrate, including the layers sequentially disposed on the substrate SUB. Accordingly, the display device 10 can be manufactured by sequentially stacking the layers using only one substrate while omitting a process of bonding the substrate to another substrate, so that the manufacturing process can be improved.

Hereinafter, the display device 10 including the light emitting element layer EL, the wavelength control layer CWL, and the color filter layer CFL will be described in detail with reference to other drawings.

Figure 3:
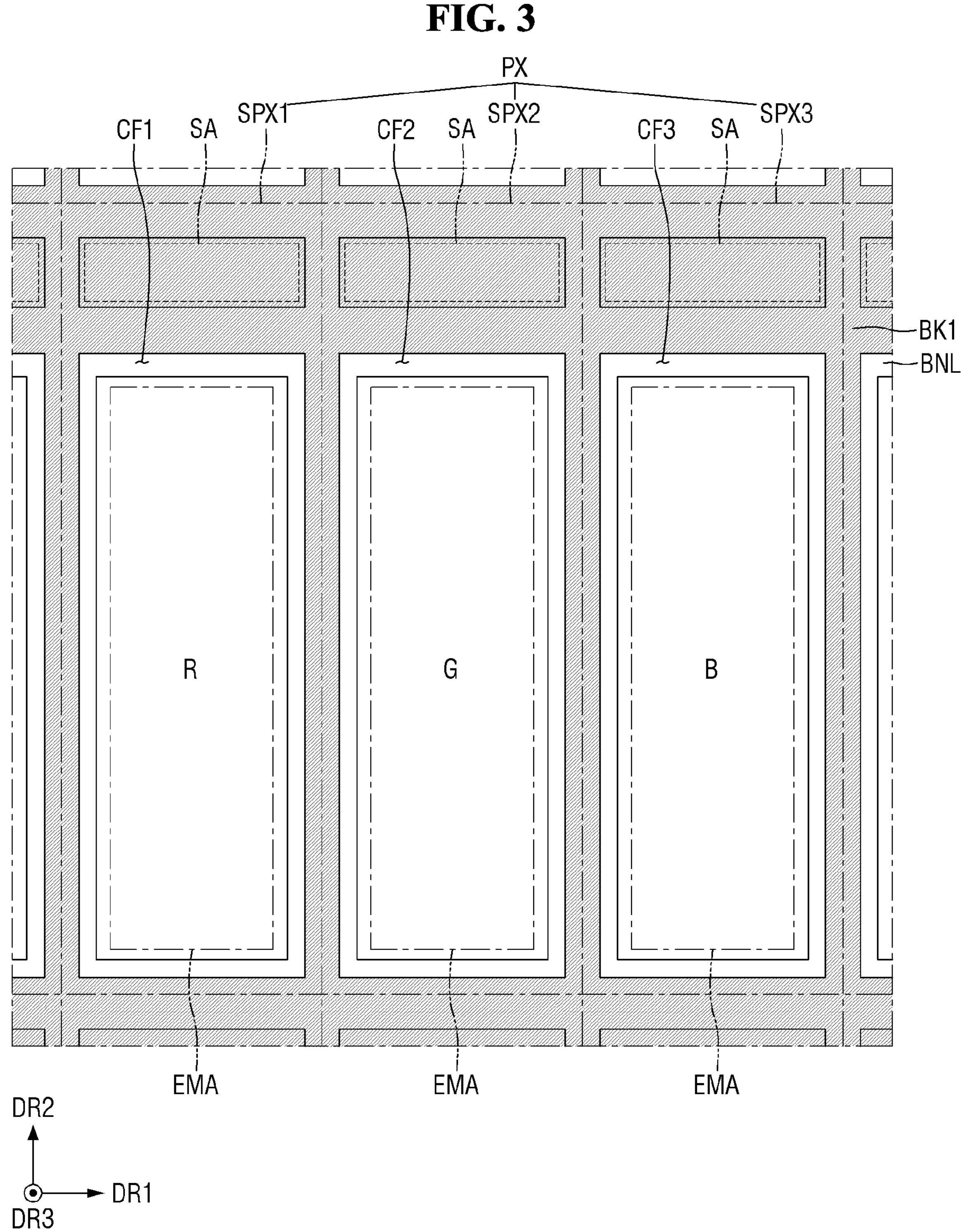
FIG. 3 is a schematic plan view showing a color filter layer disposed in a pixel of a display device according to an embodiment.
Figure 4:
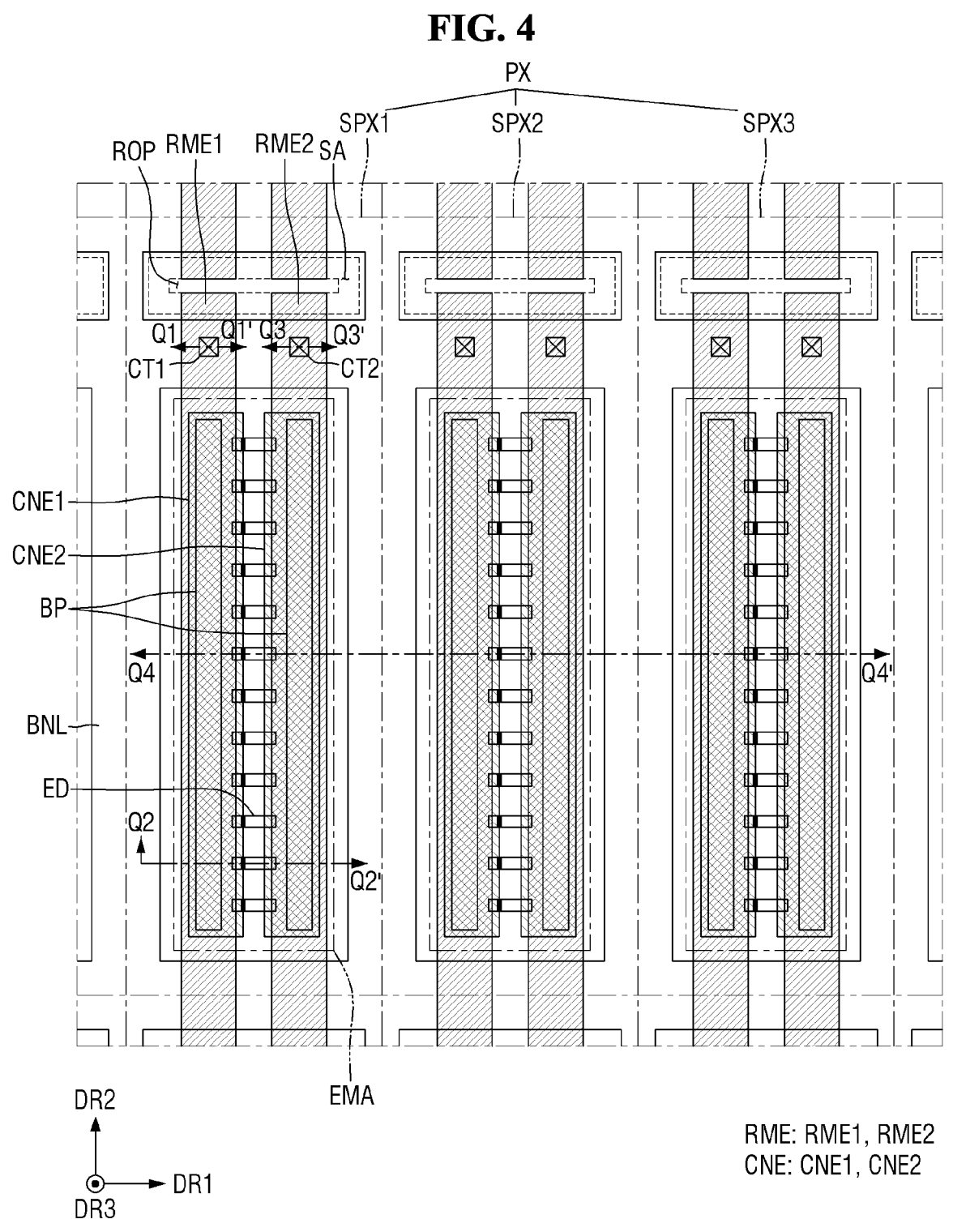
Figure 5:
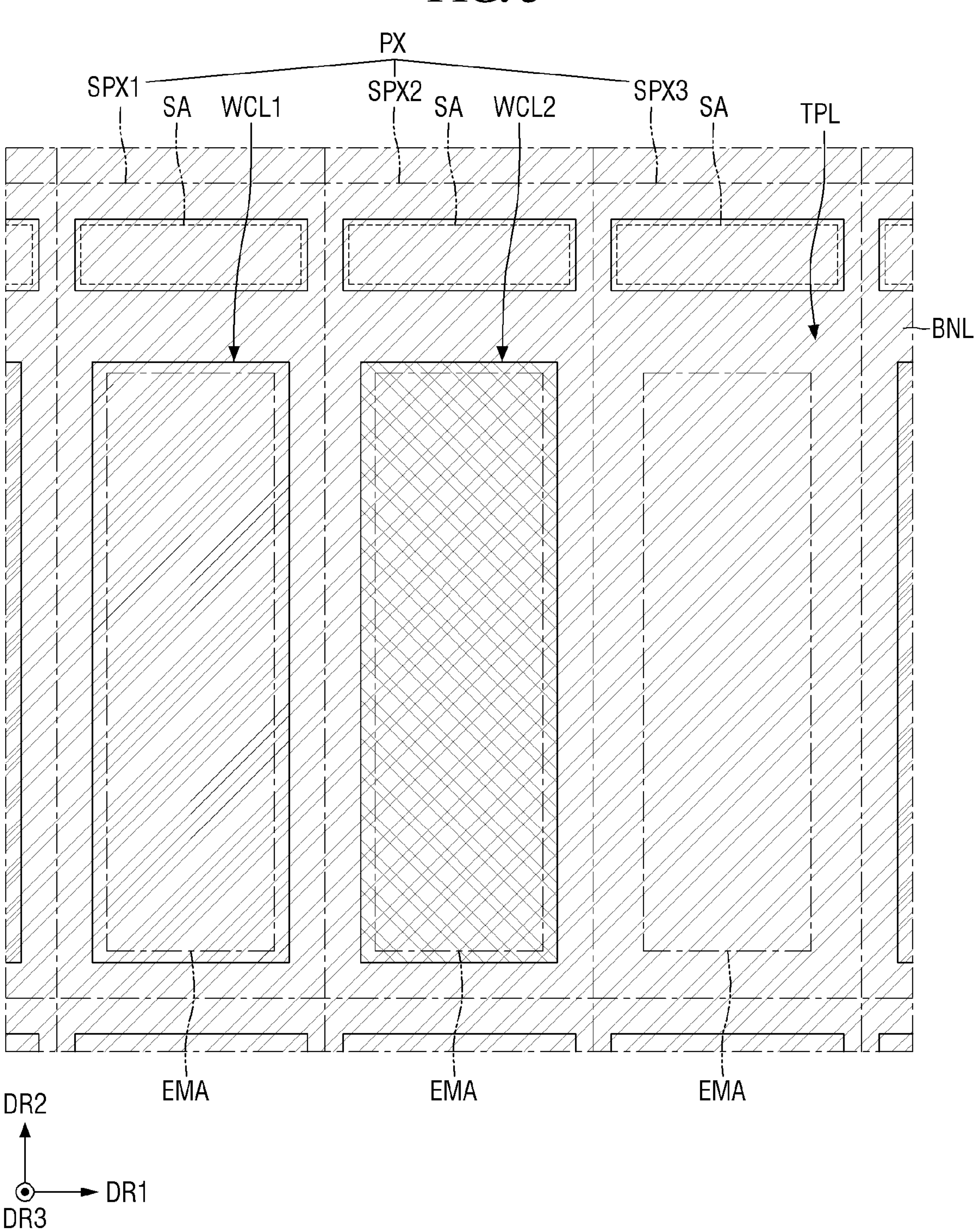
FIG. 5 is a schematic plan view showing a wavelength control layer disposed in a pixel of a display device according to an embodiment.
Figure 6:
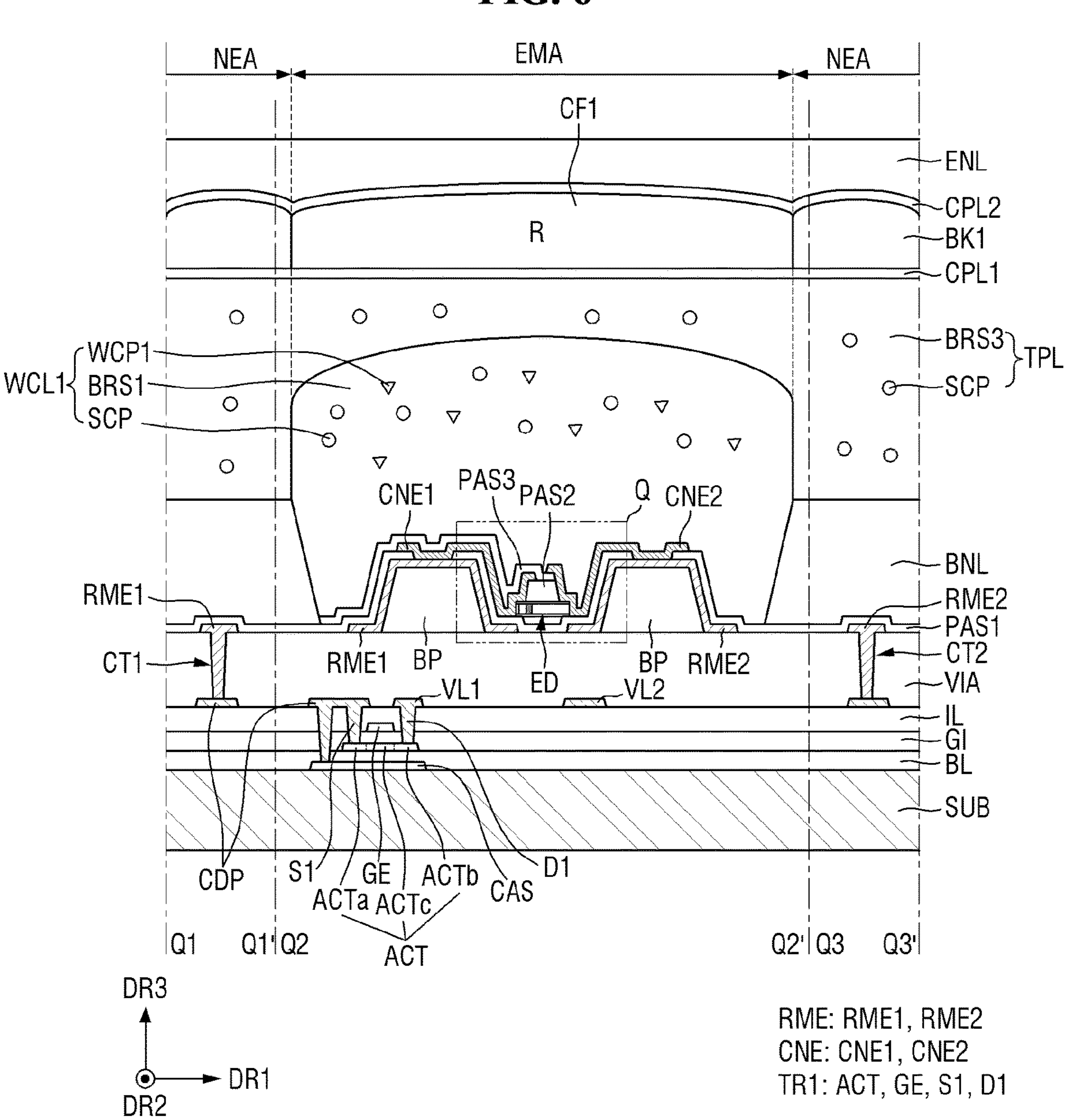
FIG. 6 is a schematic cross-sectional view taken along lines Q1-Q1', Q2-Q2', and Q3-Q3' of FIG. 4.
Figure 7:
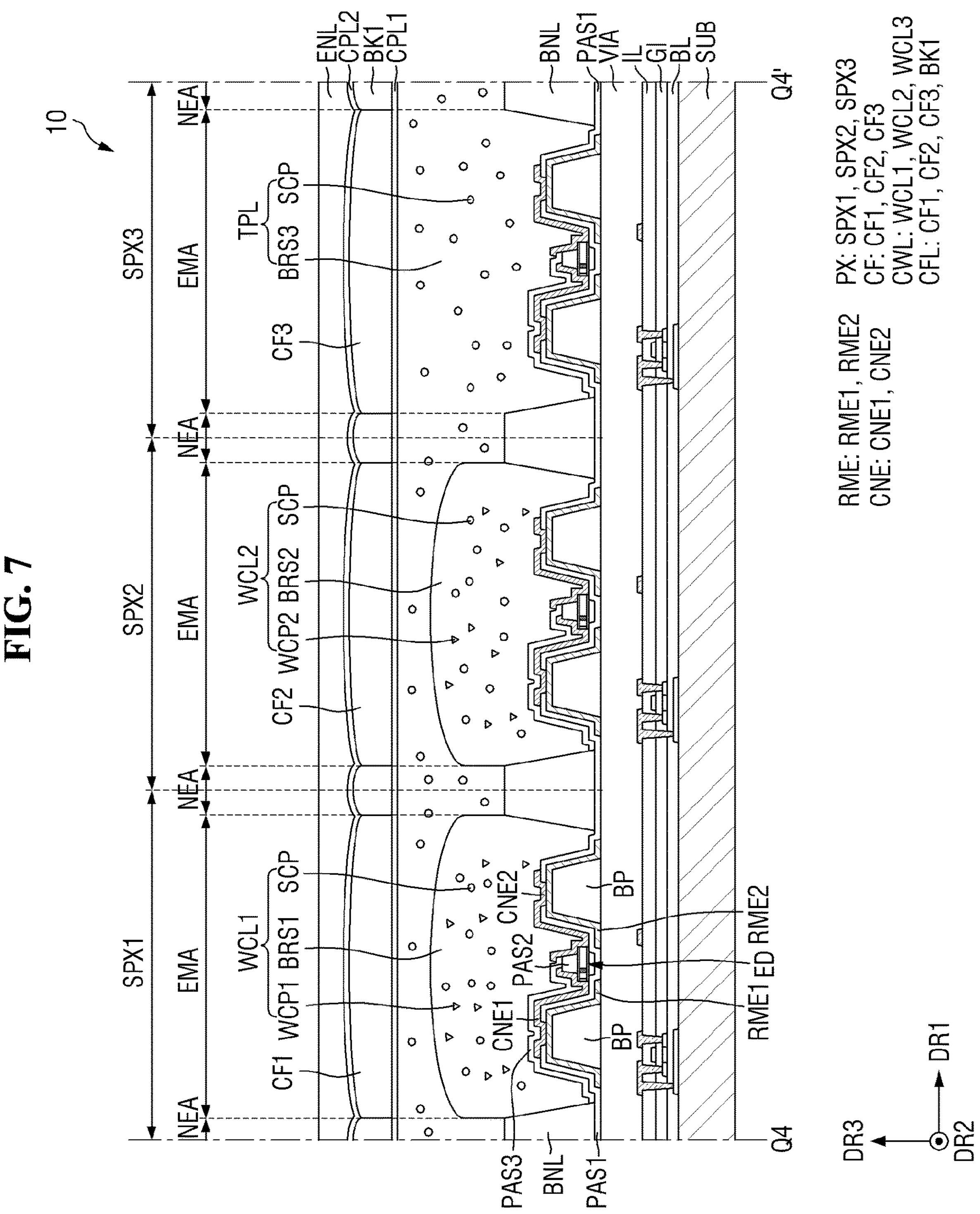
FIG. 7 is a schematic cross-sectional view taken along line Q4-Q4' of FIG. 4.

FIG. 3 is a schematic plan view showing a color filter layer disposed in a pixel of a display device according to an embodiment. FIG. 4 is a schematic plan view showing a light emitting element layer disposed in a pixel of a display device according to an embodiment. FIG. 5 is a schematic plan view showing a wavelength control layer disposed in a pixel of a display device according to an embodiment. FIG. 6 is a schematic cross-sectional view taken along lines Q1-Q1', Q2-Q2', and Q3-Q3' of FIG. 4. FIG. 7 is a schematic cross-sectional view taken along a line Q4-Q4' of FIG. 4.

FIGS. 3 to 5 schematically illustrate the layout of the light emitting element layer EL, the wavelength control layer CWL, and the color filter layer CFL with respect to the banks BNL disposed at the boundaries of the sub-pixels SPXn. FIG. 3 shows the color filter layer CFL and a first light blocking member BK1, FIG. 4 shows the light emitting element layer EL, and FIG. 5 shows the wavelength control layer CWL. FIG. 6 illustrates a cross section of the first sub-pixel SPX1, and FIG. 7 illustrates a cross section of the first to third sub-pixels SPX1, SPX2, and SPX3. FIGS. 6 and 7 show the color filter layer CFL and the wavelength control layer CWL together in portions corresponding to the cutting lines of FIG. 4.

Referring to FIGS. 3 to 7 in conjunction with FIG. 2, the banks BNL are disposed at the boundaries of the respective sub-pixels SPXn. The bank BNL may extend in the first direction DR1 and the second direction DR2, and surrounds the sub-pixel SPXn while separating the neighboring sub-pixels SPXn.

Each sub-pixel SPXn may include a non-emission area NEA (refer to FIG. 2) in addition to the emission area EMA. Further, each sub-pixel SPXn may include a sub-region SA disposed in the non-emission area NEA. The sub-region SA may be disposed on a side of the emission area EMA in the second direction DR2. The sub-region SA may be disposed between the emission areas EMA of the sub-pixels SPXn adjacent in the second direction DR2. The emission areas EMA and sub-regions SA may be arranged in the display area DA of the display device 10. For example, the emission areas EMA and the sub-regions SA may be repeatedly arranged in the first direction DR1, respectively, while being alternately arranged in the second direction DR2.

The bank BNL may be disposed between the sub-regions SA and between the emission areas EMA, and the distance therebetween may vary with the widths of the bank BNL in the second direction DR2. Since no light emitting element ED is disposed in the sub-region SA, light is not emitted from the sub-region SA, but a portion of electrodes RME disposed in each sub-pixel SPXn may extend to the sub-region SA. The electrodes RME provided for each sub-pixels SPXn may be separated from each other in the sub-region SA.

The substrate SUB may be an insulating substrate. The substrate SUB may be made of a transparent insulating material such as glass, quartz, or polymer resin. Further, the substrate SUB may be a rigid substrate, but may also be a flexible substrate which can be bent, folded or rolled.

The circuit layer CCL (refer to FIG. 2) may be disposed on the substrate SUB. The circuit layer CCL may include a first conductive layer CAS (refer to FIG. 6), a semiconductor layer, a second conductive layer, and a third conductive layer, and insulating layers disposed between them. Although the illustrated circuit layer CCL includes only one first transistor TR1 (refer to FIG. 6) and some wires, the disclosure is not limited thereto. The circuit layer CCL of the display device 10 may include a larger number of transistors in addition to the first transistor TR1, including more wires, electrodes, and semiconductor layers. The display device 10 may also include a capacitor. For example, the display device 10 may include two, three, six, or seven transistors for each sub-pixel SPXn by including one or more transistors in addition to the first transistor TR1.

A first conductive layer CAS may be disposed on the substrate SUB. The first conductive layer CAS may overlap an active layer ACT of the first transistor TR1 of the display device 10. The first conductive layer CAS may include a material capable of blocking light to prevent light from reaching the active layer ACT of the first transistor. For example, the first conductive layer CAS may be formed of an opaque metal material that blocks transmission of light. However, the disclosure is not limited thereto, and in some cases, the first conductive layer CAS may be omitted.

A buffer layer BL may be entirely disposed on the first conductive layer CAS and the first substrate SUB. The buffer layer BL may be formed on the substrate SUB to protect the first transistors TR1 of the pixel PX from moisture permeating through the substrate SUB susceptible to moisture permeation, and may perform a surface planarization function. The buffer layer BL may be formed of a inorganic layers that are alternately stacked. For example, the buffer layer BL may be formed as a double layer formed by stacking inorganic layers including at least one of silicon oxide (SiOx), silicon nitride (SiNx), and silicon oxynitride (SiOxNy). The buffer layer BL may also be formed as a multilayer structure by alternately stacking layers including those materials. Alternatively, each of the layers may be formed of a single inorganic layer including those materials.

The semiconductor layer is disposed on the buffer layer BL. The semiconductor layer may include the active layer ACT of the first transistor TR1. This may partially overlap a gate electrode GE of the second conductive layer, which will be described below.

In an embodiment, the semiconductor layer may include polycrystalline silicon, monocrystalline silicon, oxide semiconductor, or the like. When the semiconductor layer includes the oxide semiconductor, each active layer ACT may include conductive regions ACTa and ACTb and a channel region ACTc between them. The oxide semiconductor may be an oxide semiconductor containing indium (In). In some embodiments, the oxide semiconductor may be indium tin oxide (ITO), indium zinc oxide (IZO), indium gallium oxide (IGO), indium zinc tin oxide (IZTO), indium gallium zinc oxide (IGZO), indium gallium tin oxide (IGTO), indium gallium zinc tin oxide (IGZTO) or the like.

In other examples, the semiconductor layer may include polycrystalline silicon. The polycrystalline silicon may be formed by crystallizing amorphous silicon. The conductive regions of the active layer ACT may be regions doped with impurities.

A gate insulating layer GI is disposed on the semiconductor layer and the buffer layer BL. The gate insulating layer GI may function as a gate insulating layer of each transistor. The gate insulating layer GI may be formed as a double layer formed by stacking inorganic layers including at least one of silicon oxide (SiOx), silicon nitride (SiNx), and silicon oxynitride (SiOxNy). The gate insulating layer GI may also be formed as a multilayer structure by alternately stacking layers including those materials. Alternatively, each of the layers may be formed of a single inorganic layer including those materials.

The second conductive layer is disposed on the gate insulating layer GI. The second conductive layer may include the gate electrode GE of the first transistor TR1. The gate electrode GE may overlap the channel region ACTc of the active layer ACT in the thickness direction. The second conductive layer may be formed as a single layer or as multiple layers made of any one of molybdenum (Mo), aluminum (Al), chromium (Cr), gold (Au), titanium (Ti), nickel (Ni), neodymium (Nd) and copper (Cu) or an alloy thereof. However, the disclosure is not limited thereto.

An interlayer insulating layer IL may be disposed on the second conductive layer. The interlayer insulating layer IL may cover the second conductive layer to protect the second conductive layer. The interlayer insulating layer IL may be formed as a double layer formed by stacking inorganic layers including at least one of silicon oxide (SiOx), silicon nitride (SiNx), or silicon oxynitride (SiOxNy). The interlayer insulating layer IL may also be formed as a multilayer structure by alternately stacking layers including those materials. Alternatively, each of the layers may be formed of a single inorganic layer including those materials.

The third conductive layer is disposed on the interlayer insulating layer IL. The third conductive layer may include a source electrode S1 and a drain electrode D1 of the first transistor TR1, a first voltage line VL1, a second voltage line VL2, and a conductive pattern CDP.

The source electrode S1 and the drain electrode D1 of the first transistor TR1 may electrically contact the conductive regions ACTa and ACTb of the active layer ACT, respectively, through contact holes that are formed through the interlayer insulating layer IL and the gate insulating layer GI. Also, the source electrode S1 of the first transistor TR1 may be electrically connected to the first conductive layer CAS through another contact hole.

The first voltage line VL1 may be applied with a high potential voltage (or a first power voltage) transmitted to a first electrode RME1, and the second voltage line VL2 may be applied with a low potential voltage (or a second power voltage) transmitted to a second electrode RME2. A portion of the first voltage line VL1 may electrically contact the active layer ACT of the first transistor TR1 through the contact hole penetrating the interlayer insulating layer IL and the gate insulating layer GI. The first voltage line VL1 may serve as a drain electrode D1 of the first transistor TR1. The first voltage line VL1 may be directly connected to the first electrode RME1 to be described below. The second voltage line VL2 may be directly connected to the second electrode RME2 to be described below.

A conductive pattern CDP may electrically contact the active layer ACT of the first transistor TR1 through the contact hole penetrating the interlayer insulating layer IL and the gate insulating layer GI. The conductive pattern CDP may serve as a source electrode S1 of the first transistor TR1.

The third conductive layer may be formed as a single layer or multiple layers made of any one of molybdenum (Mo), aluminum (Al), chromium (Cr), gold (Au), titanium (Ti), nickel (Ni), neodymium (Nd) and copper (Cu) or an alloy thereof. However, the disclosure is not limited thereto.

A via layer VIA is disposed on the third conductive layer. The via layer VIA may include an organic insulating material, for example, an organic material such as polyimide (PI), to perform a surface planarization function.

The light emitting element layer EL may include electrodes RME (RME1 and RME2), bank patterns BP, the bank BNL, light emitting elements ED, and connection electrodes CNE1 and CNE2. These elements may be disposed on the via layer VIA. Further, insulating layers PAS1, PAS2, and PAS3 may be disposed on the via layer VIA.

The bank patterns BP may be directly disposed on the via layer VIA. The bank patterns BP, which have a shape extending in the second direction DR2 within each sub-pixel SPXn without extending to other sub-pixels SPXn adjacent in the second direction DR2, may be disposed in the emission area EMA. The bank patterns BP may be spaced apart from each other in the first direction DR1, and the light emitting element ED may be disposed therebetween. The bank patterns BP may be disposed for each sub-pixel SPXn to form a linear pattern in the display area DA of the display device 10. In drawings, two bank patterns BP are illustrated in each sub-pixel SPXn, but the disclosure is not limited thereto. A larger number of bank patterns BP may be disposed depending on the number of the electrodes RME1 and RME2.

The bank pattern BP may have a structure in which at least a part protrudes with respect to the top surface of the via layer VIA. The protruding portion of each bank pattern BP may have inclined side surfaces, and the light emitted from the light emitting element ED may be reflected by the electrodes RME disposed on the bank patterns BP and emitted in an upward direction from the via layer VIA. The bank pattern BP may provide a region in which the light emitting element ED is disposed, and may also function as a reflective partition wall that reflects light emitted from the light emitting element ED upward. The side surface of the bank pattern BP may be inclined in a linear shape, but is not limited thereto, and the outer surface of the bank pattern BP may have a curved semi-circle or semi-ellipse shape. The bank pattern BP may include an organic insulating material such as polyimide (PI), but is not limited thereto.

The electrodes RME may be disposed on the bank patterns BP and the via layer VIA. The electrodes RME may include the first electrode RME1 and the second electrode RME2. The first electrode RME1 and the second electrode RME2 may extend in the second direction DR2, and may be spaced apart from each other in the first direction DR1.

The first electrode RME1 and the second electrode RME2 may extend in the second direction DR2 within the sub-pixel SPXn while being separated from other electrodes RME1 and RME2 in the sub-regions SA. For example, the sub-region SA may be disposed between the emission areas EMA of the sub-pixels adjacent in the second direction DR2, and the first and second electrodes RME1 and RME2 may be separated, at a separation portion ROP (refer to FIG. 4) of the sub-region SA, from other first and second electrodes RME1 and RME2 disposed in the sub-pixel adjacent in the second direction DR2. However, the disclosure is not limited thereto, and some electrodes RME1 and RME2 may not be separated between the respective sub-pixels SPX1, SPX2 and SPX3, but may extend beyond the boundary of the sub-pixel adjacent in the second direction DR2, or only one of the first and second electrodes RME1 and RME2 may be separated.

The first electrode RME1 may be electrically connected to the first transistor TR1 through a first electrode contact hole CT1, and the second electrode RME2 may be electrically connected to the second voltage line VL2 through a second electrode contact hole CT2. For example, the first electrode RME1 may electrically contact the conductive pattern CDP through the first electrode contact hole CT1 which is formed through the via layer VIA in a region overlapping the bank BNL, that is between the sub-region SA and the emission area EMA. The second electrode RME2 may also be in contact with the second voltage line VL2 through the second electrode contact hole CT2 penetrating the via layer VIA. However, the disclosure is not limited thereto. In other examples, the first electrode contact hole CT1 and the second electrode contact hole CT2 may be provided in the sub-region SA.

The first electrode contact hole CT1 may electrically connect the first electrode RME1 and the conductive pattern CDP. A signal for aligning the light emitting elements ED may be applied to the first voltage line VL1 to be applied to the first electrode RME1 through the first transistor TR1 and the conductive pattern CDP. The second electrode contact hole CT2 may electrically connect the second electrode RME2 and the second voltage line VL2. The second power voltage may be applied to the second electrode RME2 through the second voltage line VL2. The first electrode RME1 and the second electrode RME2 are separated at the separation portion ROP after the alignment of the light emitting elements ED as will be described below, and the second electrode RME2 does not receive a signal from the second voltage line VL2.

In the drawings, one first electrode RME1 and one second electrode RME2 are disposed for each sub-pixel SPXn, but the disclosure is not limited thereto, and a larger number of the first electrodes RME1 and a larger number of the second electrodes RME2 may be disposed in the sub-pixel SPXn. The first electrode RME1 and the second electrode RME2 disposed in each sub-pixel SPXn may not necessarily have a shape extending in a single direction, and the first electrode RME1 and the second electrode RME2 may be arranged in other structures. For example, the first electrode RME1 or the second electrode RME2 may have a partially curved or bent shape, and one electrode may surround the other electrode.

The first electrode RME1 and the second electrode RME2 may be directly disposed on the bank patterns BP, respectively. Each of the first electrode RME1 and the second electrode RME2 may have a larger width than that of the bank pattern BP. For example, each of the first electrode RME1 and the second electrode RME2 may cover the outer surface of the bank pattern BP. The first electrode RME1 and the second electrode RME2 may be disposed on the side surfaces of the bank patterns BP, respectively, and a distance between the first electrode RME1 and the second electrode RME2 may be smaller than a distance between the bank patterns BP. Further, at least a portion of the first electrode RME1 and the second electrode RME2 may be directly disposed on the via layer VIA, so that the first electrode RME1 and the second electrode RME2 may be arranged on the same plane. However, the disclosure is not limited thereto. In some cases, the width of the first electrode RME1 and the second electrode RME2 may be smaller than that of the bank pattern BP. However, each of the first electrode RME1 and the second electrode RME2 may cover at least one side surface of the bank pattern BP to reflect the light emitted from the light emitting element ED.

The first electrode RME1 and the second electrode RME2 may include a conductive material having a high reflectance. For example, the first electrode RME1 and the second electrode RME2 may include a metal such as silver (Ag), copper (Cu), or aluminum (Al) as a material having high reflectivity, or may be an alloy including aluminum (Al), nickel (Ni), lanthanum (La), and the like. Each of the first electrode RME1 and the second electrode RME2 may reflect the light emitted from the light emitting element ED and traveling toward the side surface of the bank pattern BP in the upward direction of each sub-pixel SPXn.

However, the disclosure is not limited thereto, and the first electrode RME1 and the second electrode RME2 may further include a transparent conductive material. For example, the first electrode RME1 and the second electrode RME2 may include a material such as indium tin oxide (ITO), indium zinc oxide (IZO), and indium tin zinc oxide (ITZO). In some embodiments, the first electrode RME1 and the second electrode RME2 may stack at least one transparent conductive material and at least one metal layer having high reflectivity, or may be a single layer including these materials. For example, the first electrode RME1 and the second electrode RME2 may have a stacked structure of ITO/silver(Ag)/ITO, ITO/Ag/IZO, ITO/Ag/ITZO/IZO, or the like.

The first and second electrodes RME1 and RME2 may be used to form an electric field in the sub-pixel SPXn to align the light emitting elements ED during the manufacturing process. The light emitting element ED may be disposed between the first electrode RME1 and the second electrode RME2 by the electric field formed on the first electrode RME1 and the second electrode RME2. The light emitting elements ED of the display device 10 may be injected onto the electrodes RME through an inkjet printing process. When ink including the light emitting elements ED are injected onto the electrodes RME, an alignment signal is applied to the electrodes RME to generate the electric field. A selected voltage may be applied to the first electrode RME1 and the second electrode RME2 through the first voltage line VL1 and the second voltage line VL2 so that the light emitting elements ED can be aligned. The light emitting elements ED dispersed in the inks may be aligned by receiving the dielectrophoretic force by the electric field generated on the electrodes RME1 and RME2.

The electrodes RME1 and RME2 disposed in the different sub-pixels SPXn adjacent in the opposite direction to the second direction DR2 may be spaced apart from each other at the separation portion ROP of the sub-region SA. The electrodes RME1 and RME2 may be formed in such a way that each electrode is formed as a single electrode line extending in the second direction DR2, the light emitting elements ED are arranged and aligned on the electrode lines, and then in a subsequent process, the electrode line is separated. The electrode lines may be used to generate an electric field in the sub-pixel SPXn in order to align the light emitting elements ED during the manufacturing process of the display device 10. After aligning the light emitting elements ED, the electrode lines may be separated at the separation portion ROP to form the electrodes RME1 and RME2 of each sub-pixel SPXn separated in the second direction DR2.

The first insulating layer PAS1 may be disposed on the via layer VIA, the bank patterns BP, and the electrodes RME1 and RME2. The first insulating layer PAS1 may be disposed on the via layer VIA to cover the electrodes RME1 and RME2 and the bank patterns BP. The first insulating layer PAS1 may also be disposed in the sub area SA, but may not be disposed at the separation portion ROP where the electrodes RME1 and RME2 are separated. The first insulating layer PAS1 may protect the electrodes RME1 and RME2 while insulating the different electrodes RME1 and RME2 from each other. The first insulating layer PAS1 may prevent the light emitting element ED disposed thereon from being damaged by direct contact with other members.

In an embodiment, the first insulating layer PAS1 may have stepped portions such that the top surface thereof is partially depressed between the electrodes RME1 and RME2 spaced apart in the first direction DR1. The light emitting element ED may be disposed on the top surface of the first insulating layer PAS1, where the stepped portions are formed, and thus a space may remain between the light emitting element ED and the first insulating layer PAS1.

The bank BNL may be disposed on the first insulating layer PAS1. The bank BNL may include portions extending in the first direction DR1 and the second direction DR2 in a plan view, and thus may be arranged in a grid pattern. The bank BNL may be disposed along the boundaries between the sub-pixels SPXn to delimit the neighboring sub-pixels SPXn. The bank BNL may surround the emission area EMA and the sub-region SA, and areas partitioned and opened by the bank BNL may be the emission area EMA and the sub-region SA, respectively.

The bank BNL may have a certain height, and in some embodiments, the height of the top surface of the bank BNL may be higher than that of the bank pattern BP, and the thickness of the bank BNL may be equal to or greater than that of the bank pattern BP. However, the disclosure is not limited thereto, and the height of the top surface of the bank BNL may be equal to or lower than that of the bank pattern BP, and the thickness of the bank BNL may be smaller than that of the bank pattern BP. The bank BNL may prevent ink from overflowing to the adjacent sub-pixel SPXn in an inkjet printing step during the manufacturing process of the display device 10. The bank BNL may prevent inks where the different light emitting elements ED are dispersed in the different sub-pixels SPXn from being mixed with each other. Similar to the bank pattern BP, the bank BNL may include polyimide, but is not limited thereto.

The light emitting elements ED may be arranged on the first insulating layer PAS1. The light emitting element ED may include layers arranged in a direction parallel to the top surface of the substrate SUB. The light emitting element ED of the display device 10 may be disposed such that its extension direction is parallel to the substrate SUB, and the semiconductor layers included in the light emitting element ED may be sequentially arranged in a direction parallel to the top surface of the substrate SUB. However, the disclosure is not limited thereto. In case that the light emitting element ED has a different structure, the layers may be arranged in the third direction DR3 perpendicular to the substrate SUB.

The light emitting elements ED may be spaced apart from each other along the second direction DR2 in which the electrodes RME1 and RME2 extend, and may be aligned to be substantially parallel to each other. The light emitting element ED may have a shape extending in one direction, and the extension direction of the light emitting element ED may be substantially perpendicular to the extension direction of the electrodes RME1 and RME2. However, the disclosure is not limited thereto, and the light emitting elements ED may each be arranged diagonally to the extending direction of the electrodes RME1 and RME2, rather than being perpendicular to the extending direction.

The light emitting elements ED disposed in each sub-pixel SPXn may include emission layers and emit light of the same wavelength band. Accordingly, light of the same color may be emitted from the light emitting elements ED of first sub-pixel SPX1, the second sub-pixel SPX2, and the third sub-pixel SPX3. However, the disclosure is not limited thereto, and the sub-pixels SPXn may include different types of light emitting elements ED to emit different color lights.

Between the bank patterns BP, the light emitting element ED may have both ends respectively disposed above the electrodes RME1 and RME2. The extension length of the light emitting element ED may be longer than the distance between the first electrode RME1 and the second electrode RME2, and both ends of the light emitting element 30 may be respectively disposed above the first electrode RME1 and the second electrode RME2. For example, the light emitting element ED may be disposed such that one end is placed above the first electrode RME1 and the other end is placed above the second electrode RME2.

The ends of the light emitting element ED may electrically contact the respective connection electrodes CNE1 and CNE2. For example, an insulating layer 38 (refer to FIG. 8) may not be formed on one end surface of the light emitting element ED in the extension direction, and semiconductor layers 31 and 32 (refer to FIG. 8) or an electrode layer 37 (refer to FIG. 8) may be partially exposed, and the exposed semiconductor layers or electrode layer may electrically contact the connection electrodes CNE1 and CNE2. However, the disclosure is not limited thereto, and at least a portion of the insulating layer may be removed from the light emitting element ED to partially expose the side surfaces at both ends of the semiconductor layer. The exposed side surfaces of the semiconductor layers may directly contact the connection electrodes CNE1 and CNE2.

The second insulating layer PAS2 may be partially disposed on the light emitting element ED. For example, the second insulating layer PAS2 may have a width smaller than the extension length of the light emitting element ED and be disposed on the light emitting element ED to expose both ends of the light emitting element ED while surrounding the light emitting element ED. During the manufacturing process of the display device 10, the second insulating layer PAS2 may cover the light emitting element ED, the electrodes RME1 and RME2, and the first insulating layer PAS1 and then may be patterned to expose both ends of the light emitting element ED. The second insulating layer PAS2 may extend in the second direction DR2 on the first insulating layer PAS1 and the light emitting element ED in a plan view, thereby forming a linear or island-like pattern in each of the sub-pixels SPXn. The second insulating layer PAS2 may protect the light emitting element ED while fixing the light emitting element ED during the fabricating process of the display device 10.

The connection electrodes CNE1 and CNE2 may be disposed on the first insulating layer PAS1, the second insulating layer PAS2, and the light emitting element ED.

The connection electrodes CNE1 and CNE2 may be disposed on the electrodes RME1 and RME2, respectively. The connection electrodes CNE1 and CNE2 may include a first connection electrode CNE1 disposed on the first electrode RME1 and a second connection electrode CNE2 disposed on the second electrode RME2. The connection electrodes CNE1 and CNE2 may be spaced apart from each other or may face each other. For example, the first connection electrode CNE1 and the second connection electrode CNE2 may be disposed on the first electrode RME1 and the second electrode RME2, respectively, so as to be spaced apart from each other in the first direction DR1.

The first connection electrode CNE1 may extend in the second direction DR2 within the emission area EMA. The first connection electrode CNE1 may overlap the first electrode RME1, and may be disposed parallel to the first electrode RME1. The first connection electrode CNE1 may generally have a shape extending in the second direction DR2.

The second connection electrode CNE2 may extend in the second direction DR2 within the emission area EMA. The second connection electrode CNE2 may overlap the second electrode RME2, and may be disposed parallel to the second electrode RME2. The second connection electrode CNE2 may generally have a shape extending in the second direction DR2.

The connection electrodes CNE1 and CNE2 may each electrically contact the light emitting element ED. The first connection electrode CNE1 may electrically contact an end of the light emitting element ED, and the second connection electrode CNE2 may electrically contact the other end of the light emitting element ED. The semiconductor layer or the electrode layer may be exposed on both end surfaces of the light emitting element ED in the extension direction, and each of the connection electrodes CNE1 and CNE2 may electrically contact the semiconductor layer or the electrode layer of the light emitting element ED to be electrically connected to the light emitting element ED. One side of each of the connection electrodes CNE1 and CNE2 that contacts an end of the light emitting element ED may be disposed on the side surface of the second insulating layer PAS2. In an embodiment, the first connection electrode CNE1 may be disposed on a side surface of the second insulating layer PAS2, and the second connection electrode CNE2 may be disposed on the other side surface of the second insulating layer PAS2.

The width of each of the connection electrodes CNE1 and CNE2 measured in a direction may be less than the width of each of the electrodes RME1 and RME2 measured in the direction. The connection electrodes CNE1 and CNE2 may be disposed not only to contact one of the ends of the light emitting element ED, respectively, but also to cover a portion of the top surfaces of respective first electrode RME1 or the second electrode RME2. However, the disclosure is not limited thereto, and the connection electrodes CNE1 and CNE2 may have a width greater than the width of the electrodes RME1 and RME2 to cover both sides of the electrodes RME1 and RME2.

The connection electrodes CNE1 and CNE2 may include a transparent conductive material. For example, they may include ITO, IZO, ITZO, aluminum (Al), or the like. The light emitted from the light emitting element ED may pass through the connection electrodes CNE1 and CNE2 and travel upward. However, the disclosure is not limited thereto.

In the drawings, two connection electrodes CNE1 and CNE2 are disposed in one sub-pixel SPXn, but the disclosure is not limited thereto. The number of the connection electrodes CNE1 and CNE2 may vary depending on the number of the electrodes RME1 and RME2 disposed in each sub-pixel SPXn.

The third insulating layer PAS3 may be disposed on the first connection electrode CNE1. The third insulating layer PAS3 may electrically insulate the first connection electrode CNE1 and the second connection electrode CNE2 from each other. The third insulating layer PAS3 may cover the first connection electrode CNE1, but may not be disposed above the other end of the light emitting element ED to allow the light emitting element ED to electrically contact the second connection electrode CNE2. The third insulating layer PAS3 may partially contact the first connection electrode CNE1 and the second insulating layer PAS2 on the top surface of the second insulating layer PAS2. The side surface of the third insulating layer PAS3 on the side where the second electrode RME2 is disposed may be aligned with a side surface of the second insulating layer PAS2. Further, the third insulating layer PAS3 may be also disposed in a non-emission area, for example, on the first insulating layer PAS1 disposed on the via layer VIA. However, the disclosure is not limited thereto.

The second connection electrode CNE2 may be disposed on the second electrode RME2, the second insulating layer PAS2, and the third insulating layer PAS3. The second connection electrode CNE2 may electrically contact the other end of the light emitting element ED and the exposed top surface of the second electrode RME2. The other end of the light emitting element ED may be electrically connected to the second electrode RME2 through the second connection electrode CNE2.

The second connection electrode CNE2 may be partially contact the second insulating layer PAS2, the third insulating layer PAS3, the second electrode RME2, and the light emitting element ED. The first connection electrode CNE1 and the second connection electrode CNE2 may not contact each other due to the presence of the second insulating layer PAS2 and the third insulating layer PAS3 therebetween. However, the disclosure is not limited thereto, and in some cases, the third insulating layer PAS3 may be omitted.

Each of the first insulating layer PAS1, the second insulating layer PAS2 and the third insulating layer PAS3 described above may include an inorganic insulating material or an organic insulating material. In an embodiment, the first insulating layer PAS1, the second insulating layer PAS2 and the third insulating layer PAS3 may include an inorganic insulating material such as silicon oxide (SiOx), silicon nitride (SiNx), silicon oxynitride (SiOxNy), aluminum oxide (AlOx), aluminum nitride (AlNx), and the like. In other examples, they may include an organic insulating material such as acrylic resin, epoxy resin, phenolic resin, polyamide resin, polyimide resin, unsaturated polyester resin, polyphenylene resin, polyphenylenesulfide resin, benzocyclobutene, cardo resin, siloxane resin, silsesquioxane resin, polymethylmethacrylate, polycarbonate, polymethylmethacrylate-polycarbonate synthetic resin, and the like. However, the disclosure is not limited thereto.

The wavelength control layer CWL may be disposed on the light emitting element layer EL. According to an embodiment, the wavelength control layer CWL may be disposed in a region surrounded by the bank BNL. The wavelength control layer CWL may be disposed in each sub-pixel SPXn, but it may be disposed, within the region surrounded by the bank BNL, only in the emission area EMA without being disposed in the sub-region SA. The sub-region SA is an area in which the light emitting elements ED of the light emitting element layer EL are not disposed, and light may not be substantially emitted from the sub-region SA. In the area of the light emitting element layer EL in which the light emitting elements ED are disposed, the wavelength control layer CWL may be disposed in the region surrounded by the bank BNL.

In some embodiments, the height of the wavelength control layer CWL may be larger than the height of the bank BNL. The wavelength control layer CWL may be formed through an inkjet printing process or a photolithography process in the manufacturing process of the display device 10. The wavelength control layer CWL may be formed through a drying process or an exposure/development process after the material of the wavelength control layer CWL is sprayed or coated into the region surrounded by the bank BNL. For example, the material forming the wavelength control layer CWL may include an organic material and have viscosity. Thus, even if this organic material is sprayed or coated up to a position higher than the bank BNL, it may not overflow into the other sub-pixel SPXn beyond the bank BNL. For the reason, the height of the wavelength control layer CWL may be set to be higher than that of the bank BNL. However, the disclosure is not limited thereto.

In an embodiment in which the light emitting element layer EL of each sub-pixel SPXn emits the light of the first color, the wavelength control layer CWL may include a first wavelength conversion layer WCL1 disposed in the first sub-pixel SPX1, a second wavelength conversion layer WCL2 disposed in the second sub-pixel SPX2, and a light transmitting layer TPL disposed in the first to third sub-pixels SPX1, SPX2, and SPX3.

The first wavelength conversion layer WCL1 may include a first base resin BRS1 and a first wavelength conversion material WCP1 provided in the first base resin BRS1. The second wavelength conversion layer WCL2 may include a second base resin BRS2 and a second wavelength conversion material WCP2 provided in the second base resin BRS2. The first wavelength conversion layer WCL1 and the second wavelength conversion layer WCL2 may transmit the light of the first color incident from the light emitting element layer EL while converting the wavelength thereof. Scatterers SCP of the first wavelength conversion layer WCL1 and the second wavelength conversion layer WCL2 may increase wavelength conversion efficiency.

The light transmitting layer TPL may include a third base resin BRS3 and scatterers SCP contained in the third base resin BSR3. The light transmitting layer TPL transmits the light of the first color incident from the light emitting element layer EL while maintaining the wavelength thereof. The scatterer SCP of the light transmitting layer TPL may serve to control an emission path of the light emitted through the light transmitting layer TPL. The light transmitting layer TPL may not include a wavelength conversion material.

The scatterer SCP may have a refractive index different from those of the first to third base resins BRS1, BRS2, and BRS3. The scatterer SCP may be a metal oxide particle or an organic particle. Examples of the metal oxide particle may include titanium oxide ($TiO_2$), zirconium oxide ($ZrO_2$), aluminum oxide ($Al_2O_3$), indium oxide ($In_2O_3$), zinc oxide ($ZnO_2$), silica, barium sulfate ($BaSO_4$), tin oxide ($SnO_2$), and the like, and examples of the organic particle may include polystyrene, polymethyl methacrylate (PMMA), and the like. The scatterer SCP may have a hollow structure, but is not limited thereto.

The size of the scatterer SCP may be relevant to the wavelength of the light emitted from the light emitting element ED. For example, when the wavelength of the light emitted from the light emitting element ED is λ, the size of the scatterer SCP may be in a range from about λ/10 to about 5λ. For example, the size of the scatterer SCP may be about λ/2, but is not limited thereto. In another example, when the light emitted from the light emitting element ED has a peak wavelength of about 480 nm or less, for example a peak wavelength in a range of about 445 nm to about 480 nm, the size of the scatterer SCP may be in a range of about 150 nm to about 300 nm.

The first to third base resins BRS1, BRS2, and BRS3 may include a light transmitting organic material. For example, the first to third base resins BRS1, BRS2, and BRS3 may include an epoxy resin, an acrylic resin, a cardo resin, an imide resin, or the like. The first to third base resins BRS1, BRS2 and BRS3 may be formed of a same material, but the disclosure is not limited thereto.

The first wavelength conversion material WCP1 may convert the light of the first color into the light of the second color, and the second wavelength conversion material WCP2 may convert the light of the first color into the light of the third color. The first wavelength conversion material WCP1 and the second wavelength conversion material WCP2 may be quantum dots, quantum bars, phosphors or the like.

For example, the first wavelength conversion material WCP1 may be a material that converts blue light into red light. The second wavelength conversion material WCP2 may be a material that converts blue light into green light. The first wavelength conversion material WCP1 and the second wavelength conversion material WCP2 may be quantum dots (QDs), quantum bars, fluorescent materials, or phosphorescent materials. Examples of the quantum dot may include group IV nanocrystals, group II-VI compound nanocrystals, group III-V compound nanocrystals, group IV-VI nanocrystals, and a combination thereof.

The quantum dot may include a core and a shell surrounding the core. The core may be at least one of, for example, CdS, CdSe, CdTe, ZnS, ZnSe, ZnTe, GaN, GaP, GaAs, GaSb, AlP, AlAs, AlSb, InP, InAs, InSb, SiC, Ca, Se, In, P, Fe, Pt, Ni, Co, Al, Ag, Au, Cu, FePt, Fe2O3, Fe3O4, Si and Ge, but is not limited thereto. The shell may include at least one of, for example, ZnS, ZnSe, ZnTe, CdS, CdSe, CdTe, HgS, HgSe, HgTe, AlN, AlP, AlAs, AlSb, GaN, GaP, GaAs, GaSb, GaSe, InN, InP, InAs, InSb, TlN, T1P, TlAs, TlSb, PbS, PbSe and PbTe, but is not limited thereto.

The fluorescent material may be an inorganic fluorescent material, and an inorganic phosphor such as garnets, silicates, sulfides, oxynitrides, nitrides, or aluminates may be used. The inorganic phosphor may include, for example, at least one of $Y_3Al_5O_{12}:Ce^{3+}$ (YAG:Ce), $Tb_3Al_5O_{12}:Ce^{3+}$ (TAG:Ce), $(Sr, Ba, Ca)_2SiO_4:Eu^{2+}$, $(Sr, Ba, Ca, Mg, Zn)_2Si(OD)_4:Eu^{2+}$ D=F, Cl, S, N, Br, $Ba_2MgSi_2O_7:Eu^{2+}$, $Ba_2SiO_4:Eu^{2+}$, $Ca_3(Sc, Mg)_2Si_3O_{12}:Ce^{3+}$, $(Ca, Sr)S:Eu^{2+}$, $(Sr, Ca)Ga_2S_4:Eu^{2+}$, $SrSi_2O_2N_2:Eu^{2+}$, $SiAlON:Ce^{3+}$, $\beta$-$SiAlON:Eu^{2+}$, Ca-$\alpha$-$SiAlON:Eu^{2+}$, $Ba_3Si_6O_{12}N_2:Eu^{2+}$, $CaAlSiN_3:Eu^{2+}$, $(Sr, Ca)AlSiN_3:Eu^{2+}$, $Sr_2Si_5N_8:Eu^{2+}$, $(Sr, Ba)Al_2O_4:Eu^{2+}$, $(Mg, Sr)Al_2O_4:Eu^{2+}$, and $BaMg_2Al_{16}O_{27}:Eu^{2+}$, but is not limited thereto. However, the disclosure is not limited thereto, and the fluorescent material may include an organic fluorescent material.

The wavelength control layer CWL may be directly disposed on the light emitting element layer EL. In the display device 10, since the bank BNL has a selected height and may surround the sub-pixel SPXn, the base resins BRS1, BRS2 and BRS3 of the wavelength control layer CWL may be directly disposed on the third insulating layer PAS3 and the second connection electrode CNE2 of the light emitting element layer EL.

The base resins BRS1, BRS2 and BRS3 of the wavelength control layer CWL may be disposed, in the region surrounded by the bank BNL, to surround the light emitting element ED, the bank patterns BP, the electrodes RME, and the contact electrodes CNE1 and CNE2 of the light emitting element layer EL. The scatterer SCP and the wavelength conversion materials WCP1 and WCP2 of the wavelength control layer CWL may be disposed in each of the base resins BRS1, BRS2 and BRS3, and may be disposed in the vicinity of light emitting element layer EL.

In an embodiment, the first wavelength conversion layer WCL1 of the wavelength control layer CWL may be disposed in the first sub-pixel SPX1, and the second wavelength conversion layer WCL2 may be disposed in the second sub-pixel SPX2. The light transmitting layer TPL may be disposed in the first sub-pixel SPX1, the second sub-pixel SPX2 and the third sub-pixel SPX3. The light transmitting layer TPL may be disposed on the first wavelength conversion layer WCL1 and the second wavelength conversion layer WCL2 to cover them. The light transmitting layer TPL may be directly disposed on and contact the third insulating layer PAS3 and the second connection electrode CNE2 of the light emitting element layer EL disposed in the third sub-pixel SPX3. The light transmitting layer TPL may contact at least one of the top surface and the side surface of the bank BNL which separates the sub-pixels SPXn.

The light transmitting layer TPL may constitute the upper portion of the wavelength control layer CWL to planarize the top surface of the wavelength control layer CWL. Accordingly, even if the first wavelength conversion layer WCL1 or the second wavelength conversion layer WCL2 is formed in an inverse tapered shape, it is possible to prevent discontinuous formation of the first capping layer CPL1 to be described below, which is formed on the first wavelength conversion layer WCL1 and the second wavelength conversion layer WCL2. The first capping layer CPL1 may serve to cover the wavelength control layer CWL entirely to protect the wavelength control layer CWL from external moisture or oxygen. By planarizing the portion under the first capping layer CPL1 so that the first capping layer CPL1 is continuously formed to completely cover the wavelength control layer CWL, the light transmitting layer TPL can prevent deterioration of the light emitting element ED and the wavelength conversion materials WCP1 and WCP2 of the wavelength control layer CWL from external moisture or oxygen.

The wavelength control layer CWL described above may be formed by forming the first wavelength conversion layer WCL1 through a photolithography process, forming the second wavelength conversion layer WCL2, and then coating the light transmitting layer TPL on the entire display area of the substrate SUB. However, the disclosure is not limited thereto, and the first wavelength conversion layer WCL1 and the second wavelength conversion layer WCL2 may be formed in the reverse order.

The light emitted from the respective light emitting element layers EL may be light L1 of a same first color. The light emitted from both ends of the light emitting element ED may travel toward the wavelength control layer CWL. The light L1 emitted from the light emitting element ED of a first light emitting element layer EL1 disposed in the first sub-pixel SPX1 is incident to the first wavelength conversion layer WCL1; the light L1 emitted from the light emitting element ED of a second light emitting element layer EL2 disposed in the second sub-pixel SPX2 is incident to the second wavelength conversion layer WCL2; and the light L1 emitted from the light emitting element ED of a third light emitting element layer EL3 disposed in the third sub-pixel SPX3 is incident to the light transmitting layer TPL. The light incident to the first wavelength conversion layer WCL1 may be converted into the light L2 of the second color, and the light incident to the second wavelength conversion layer WCL2 may be converted into the light L3 of the third color. The light incident to the light transmitting layer TPL from the third sub-pixel SPX3 may be transmitted as light L1 of the first color without undergoing wavelength conversion. The light L2 of the second color and the light L3 of the third color are incident to the light transmitting layer TPL, but the light L2 of the second color and the light L3 of the third color may be transmitted through the light transmitting layer TPL or scattered without undergoing further wavelength conversion. Even if the respective sub-pixels PXn may include the light emitting element layers EL emitting light of the same color, they may display different color lights depending on the layout of the wavelength control layer CWL disposed thereon.

The first capping layer CPL1 may be disposed on the wavelength control layer CWL. The first capping layer CPL1 may be disposed on the wavelength control layer CWL to cover the wavelength control layer CWL. The first capping layer CPL1 may be disposed between the color filter layer CFL and the light transmitting layer TPL. The first capping layer CPL1 may contact the top surface of the light transmitting layer TPL. In an embodiment, the first capping layer CPL1 seals the light transmitting layer TPL so that damage or contamination of the light transmitting layer TPL and the first and second wavelength conversion layers WCL1 and WCL2 disposed under the light transmitting layer TPL may be prevented.

The first capping layer CPL1 may contain an inorganic material. For example, the first capping layer CPL1 may contain at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. Although in the drawing the first capping layer CPL1 is formed as a single layer, the disclosure is not limited thereto. For example, the first capping layer CPL1 may be formed as a multilayer in which inorganic layers, each of which includes at least one of the aforementioned materials, are alternately stacked. The thickness of the first capping layer CPL1 may be in a range of about 0.05 μm to about 2 μm, but is not limited thereto.

The color filter layer CFL may be disposed on the first capping layer CPL1 in the display area DA. The color filter layer CFL may include the first light blocking member BK1 and color filters CF disposed in a space partitioned by the first light blocking member BK1.

The first light blocking member BK1 may be disposed on the first capping layer CPL1. On the first capping layer CPL1, the first light blocking member BK1 may be disposed in the non-emission area NEA along the boundaries of the first to third sub-pixels SPX1, SPX2 and SPX3. The first light blocking member BK1 may overlap the bank BNL in the thickness direction of the display device 10 (e.g., the third direction DR3).

The first light blocking member BK1 may not only block light emission, but also suppress reflection of external light. The first light blocking member BK1 may be formed in a lattice shape, surrounding the emission area EMA in a plan view. The first light blocking member BK1 may not be disposed in the emission area EMA of each sub-pixel SPXn, but may be disposed in the sub-region SA. For example, the first light blocking member BK1 may surround the emission area EMA. In an embodiment, the first light blocking member BK1 may have a smaller width than the bank BNL. However, the disclosure is not limited thereto, and the first light blocking member BK1 may have substantially the same width as the bank BNL.

The first light blocking member BK1 may include an organic material. In an embodiment, the first light blocking member BK1 may include a light absorbing material that absorbs a visible wavelength band. As the first light blocking member BK1 includes the light absorbing material and is disposed along the boundaries of the first to third sub-pixels SPX1, SPX2 and SPX3, the emission area EMA may be defined by (or surrounded by) the first light blocking member BK1.

The color filter CF may include a first color filter CF1, a second color filter CF2, and a third color filter CF3.

The first color filter CF1 is disposed in the emission area EMA of the first sub-pixel SPX1; the second color filter CF2 is disposed in the emission area EMA of the second sub-pixel SPX2; and the third color filter CF3 may be disposed in the emission area EMA of the third sub-pixel SPX3. The first to third color filters CF1, CF2 and CF3 may be surrounded by the first light blocking member BK1.

The first to third color filters CF1, CF2, and CF3 may include a colorant such as a dye or pigment that absorbs a wavelength other than a corresponding color wavelength. The first color filter CF1 may selectively allow the second color light (e.g., red light) to pass through, and block or absorb the first color light (e.g., blue light) and the third color light (e.g., green light). The second color filter CF2 may selectively allow the third color light (e.g., green light) to pass therethrough, and block or absorb the first color light (e.g., blue light) and the second color light (e.g., red light). The third color filter CF3 may selectively allow the first color light (e.g., blue light) to pass therethrough, and block or absorb the second color light (e.g., red light) and the third color light (e.g., green light). For example, the first color filter CF1 may be a red color filter, the second color filter CF2 may be a green color filter, and the third color filter CF3 may be a blue color filter.

In an embodiment, the light having reached the first color filter CF1 may be light converted into the light of the second color in the first wavelength conversion layer WCL1, and the light having reached the second color filter CF2 may be light converted into the light of the third color in the second wavelength conversion layer WCL2, and the light having reached the third color filter CF3 may be light of the first color transmitted through the light transmitting layer TPL. As a result, the light of the second color having passed through the first color filter CF1, the light of the third color having passed through the second color filter CF2, and the light of the first color having passed through the third color filter CF3 may be emitted upwards from the substrate SUB to realize a full color display.

The first to third color filters CF1, CF2, and CF3 may absorb a portion of the light coming from the outside of the display device 10 to reduce the reflected light of the external light. Thus, the first to third color filters CF1, CF2, and CF3 can prevent color distortion caused by the reflection of external light.

In an embodiment, the area of the opening of the first light blocking member BK1 may be different for each sub-pixel SPXn. Depending on the color material included in the color filter layer CFL, the opening of the first light blocking member BK1 may have a different area for each sub-pixel SPXn, and since the bank BNL is disposed to correspond to the area of the opening of the first light blocking member BK1, the area of each sub-pixel SPXn may be different. For example, the first color filter CF1 including a red color material may be disposed in the first sub-pixel SPX1, and the area of the first sub-pixel SPX1 may be larger than those of the second sub-pixel SPX2 and the third sub-pixel SPX3. Also, the second color filter CF2 including a green color material may be disposed in the second sub-pixel SPX2, and the area of the second sub-pixel SPX2 may be larger than that of the third sub-pixel SPX3. However, the disclosure is not limited thereto. The area of at least one of the sub-pixels SPXn may be different from those of the other sub-pixels SPXn, and their size relationships may be different from the example described above. In the display device 10, the area of each sub-pixel PXn may be designed to be different to prevent degradation of display quality that might be caused by reflection of external light.

The color filter layer CFL may be disposed in the emission area EMA of each sub-pixel SPXn. Although it is illustrated in the drawing that the color filter layer CFL is disposed for each sub-pixel SPXn individually to form island-shaped patterns, the disclosure is not limited thereto. The color filter layer CFL may form a linear pattern in the entire display area DA.

The color filter layer CFL is disposed on the first and second wavelength conversion layers WCL1 and WCL2 and the light transmitting layer TPL, so that the display device 10 may not require a separate substrate for the color filter layer CFL. Therefore, the thickness of the display device 10 may be relatively reduced.

The second capping layer CPL2 may be disposed on the color filter layer CFL. The second capping layer CPL2 may be disposed on the first to third color filters CF1, CF2 and CF3 and the first light blocking member BK1, covering them. The second capping layer CPL2 may protect the color filter layer CFL.

The encapsulation layer ENL may be disposed on the second capping layer CPL2. The encapsulation layer ENL may include at least one thin film encapsulation layer to protect the members disposed on the substrate SUB from external moisture or oxygen. For example, the encapsulation layer ENL may be formed of a single encapsulation layer including an inorganic material, but is not limited thereto. When the encapsulation layer ENL includes the inorganic material, the inorganic material may include silicon nitride, silicon oxide, silicon oxynitride, or the like.

Figure 8:
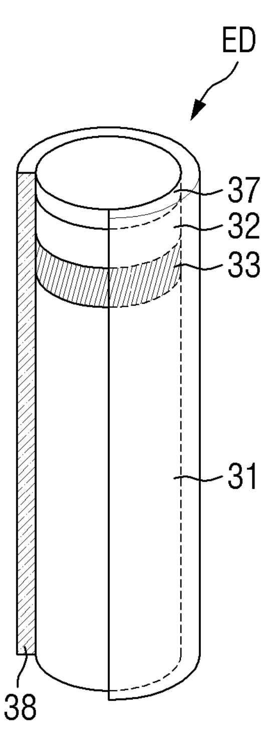
FIG. 8 is a schematic perspective view of a light emitting element according to an embodiment.

FIG. 8 is a perspective view of a light emitting element according to an embodiment.

Referring to FIG. 8, the light emitting element ED which is a particulate element may have a rod or cylindrical shape having a selected aspect ratio. The light emitting element ED may have a size of a nanometer scale (equal to or greater than about 1 nm and less than about 1 μm) to a micrometer scale (equal to or greater than about 1 μm and less than about 1 mm). In an embodiment, both the diameter and the length of the light emitting element ED may be on a nanometer scale, or on a micrometer scale. In other examples, the diameter of the light emitting element ED may be on a nanometer scale, while the length of the light emitting element ED may be on a micrometer scale. In some embodiments, some of the light emitting elements ED may have a diameter and/or length on a nanometer scale, while some others of the light emitting elements ED may have a diameter and/or length on a micrometer scale.

In an embodiment, the light emitting element ED may be an inorganic light emitting diode. For example, the light emitting element ED may include a semiconductor layer doped with any conductivity type (e.g., p-type or n-type) impurities. The semiconductor layer may emit light of a selected wavelength band by receiving an electrical signal applied from an external power source.

The light emitting element ED according to one embodiment may include a first semiconductor layer 31, a light emitting layer 33, a second semiconductor layer 32, and an electrode layer 37 sequentially stacked in a longitudinal direction. The light emitting element may further include an insulating film 38 covering the outer surfaces of the first semiconductor layer 31, the second semiconductor layer 32, and the light emitting layer 33.

The first semiconductor layer 31 may be an n-type semiconductor. When the light emitting element ED emits light of a blue wavelength band, the first semiconductor layer 31 may include a semiconductor material having a chemical formula of AlxGayIn1-x-yN ($0 \leq x \leq 1$, $0 \leq y \leq 1$, $0 \leq x+y \leq 1$). For example, it may be any one or more of n-type doped AlGaInN, GaN, AlGaN, InGaN, AlN and InN. The first semiconductor layer 31 may be doped with an n-type dopant, and the n-type dopant may be Si, Ge, Sn, or the like. For example, the first semiconductor layer 31 may be n-GaN doped with n-type Si. The length of the first semiconductor layer 31 may be in a range of about 1.5 μm to about 5 but is not limited thereto.

The second semiconductor layer 32 may be disposed on a light emitting layer 33 to be described below. The second semiconductor layer 32 may be a p-type semiconductor. When the light emitting element ED emits light of a blue or green wavelength band, the second semiconductor layer 32 may include a semiconductor material having a chemical formula of AlxGayIn1-x-yN ($0 \leq x \leq 1$, $0 \leq y \leq 1$, $0 \leq x+y \leq 1$). For example, it may be any one or more of p-type doped AlGaInN, GaN, AlGaN, InGaN, AlN and InN. The second semiconductor layer 32 may be doped with a p-type dopant, and the p-type dopant may be Mg, Zn, Ca, Se, Ba, or the like. For example, the second semiconductor layer 32 may be p-GaN doped with p-type Mg. The length of the second semiconductor layer 32 may be in a range of about 0.05 μm to about 0.10 μm, but is not limited thereto.

Although the drawings illustrate that the first semiconductor layer 31 and the second semiconductor layer 32 are configured as single layers, the disclosure is not limited thereto. Depending on the material of the light emitting layer 33, the first semiconductor layer 31 and the second semiconductor layer 32 may further include a larger number of layers, such as a cladding layer or a tensile strain barrier reducing (TSBR) layer.

The light emitting layer 33 may be disposed between the first semiconductor layer 31 and the second semiconductor layer 32. The light emitting layer 33 may include a material having a single or multiple quantum well structure. When the light emitting layer 33 includes a material having a multiple quantum well structure, quantum layers and well layers may be stacked alternately. The light emitting layer 33 may emit light by coupling of electron-hole pairs according to an electrical signal applied through the first semiconductor layer 31 and the second semiconductor layer 32. When the light emitting layer 33 emits light of a blue wavelength band, a material such as AlGaN or AlGaInN may be included. In case that the light emitting layer 33 has a multiple quantum well structure in which quantum layers and well layers are alternately stacked, the quantum layer may include a material such as AlGaN or AlGaInN, and the well layer may include a material such as GaN or AlInN. For example, as described above, the light emitting layer 33 may include AlGaInN as a quantum layer and AlInN as a well layer, and the light emitting layer 33 may emit blue light having a central wavelength band of 450 nm to 495 nm.

However, the disclosure is not limited thereto, and the light emitting layer 33 may have a structure in which semiconductor materials having large band gap energy and semiconductor materials having small band gap energy are alternately stacked, and may include other group III to V semiconductor materials according to the wavelength band of the emitted light. The light emitted by the light emitting layer 33 is not limited to the light of the blue wavelength band, but the light emitting layer 33 may also emit light of a red or green wavelength band. The length of the light emitting layer 33 may be in a range of about 0.05 μm to about 0.10 but is not limited thereto.

Light emitted from the light emitting layer 33 may be emitted to both side surfaces as well as the outer surface of the light emitting element ED in the longitudinal direction. The directionality of light emitted from the light emitting layer 33 is not limited to a single direction.

The electrode layer 37 may be an ohmic connection electrode. However, the disclosure is not limited thereto, and it may be a Schottky connection electrode. The light emitting element ED may include at least one electrode layer 37. Although FIG. 8 illustrates that the light emitting element ED includes one electrode layer 37, the disclosure is not limited thereto. In some cases, the light emitting element ED may include a larger number of electrode layers 37 or none. The following description may apply to a light emitting element ED where the number of electrode layers 37 is different or other structures are further included.

In the display device 10 according to an embodiment, when the light emitting element ED is electrically connected to an electrode or a connection electrode, the electrode layer 37 may reduce the resistance between the light emitting element ED and the electrode or connection electrode. The electrode layer 37 may include a conductive metal. For example, the electrode layer 37 may include at least one of aluminum (Al), titanium (Ti), indium (In), gold (Au), silver (Ag), indium tin oxide (ITO), indium zinc oxide (IZO), and indium tin zinc oxide (ITZO). Further, the electrode layer 37 may include an n-type or p-type doped semiconductor material. The electrode layer 37 may include a single material or a variety of different materials, but is not limited thereto.

The insulating film 38 may surround the outer surfaces of the semiconductor layers and electrode layers described above. For example, the insulating film 38 may surround the outer surface of at least the light emitting layer 33, and the light emitting element ED may be elongated in one direction. The insulating film 38 may protect the members. The insulating film 38 may be formed to surround side surfaces of the members while exposing both ends of the light emitting element ED in the longitudinal direction.

Although in the drawing the insulating film 38 extends in the longitudinal direction of the light emitting element ED and covers the side surface of the light emitting element ED from the first semiconductor layer 31 to the electrode layer 37, the disclosure is not limited thereto. The insulating film 38 may cover only the light emitting layer 33 and only a part of the outer surfaces of some of the semiconductor layers, or may cover only a portion of the outer surface of the electrode layer 37 and partially expose the outer surface the electrode layer 37. Further, in cross-sectional view, the insulating film 38 may have a top surface, which is rounded in a region adjacent to at least one end of the light emitting element ED.

The thickness of the insulating film 38 may be in a range of about 10 nm to about 1.0 μm, but is not limited thereto. For example, the thickness of the insulating film 38 may be around 40 nm.

The insulating film 38 may include materials having insulating properties, for example, silicon oxide (SiOx), silicon nitride (SiNx), silicon oxynitride (SiOxNy), aluminum nitride (AlN), aluminum oxide (AlxOy), and the like. Accordingly, it is possible to prevent an electrical short circuit that may occur when the light emitting layer 33 directly contacts the electrode through which the electrical signal is transmitted to the light emitting element ED. Since the insulating film 38 protects the outer surface of the light emitting element ED including the light emitting layer 33, it is possible to prevent degradations in light emission efficiency.

Further, the insulating film 38 may have an outer surface which is surface-treated. The light emitting elements ED may be aligned by spraying on the electrodes an ink in which the light emitting elements ED are dispersed. The surface of the insulating film 38 may be treated to have a hydrophobic property or hydrophilic property in order to keep the light emitting elements ED dispersed in the ink without becoming agglomerated with other adjacent light emitting elements ED in the ink. For example, the insulating film 38 may be surface-treated on the outer surface with a material such as stearic acid and 2,3-naphthalene dicarboxylic acid.

Figure 9:
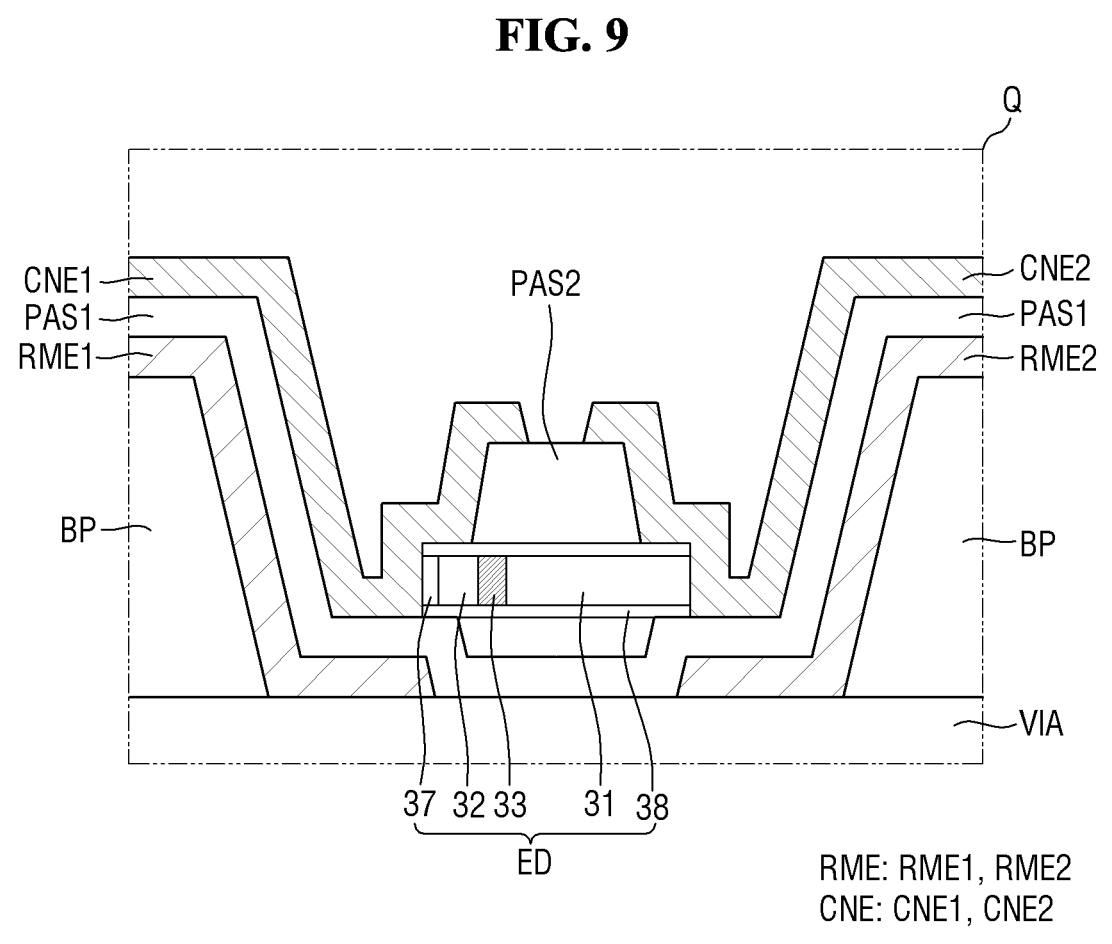

FIG. 9 is an enlarged schematic cross-sectional view illustrating another example of area Q of FIG. 6.

Referring to FIG. 9, the display device 10 according to the embodiment is different from the embodiment of FIG. 6 in that the first connection electrode CNE1 and the second connection electrode CNE2 are formed on the same layer, and the third insulating layer PAS3 is omitted.

The first connection electrode CNE1 and the second connection electrode CNE2 may be directly disposed on the second insulating layer PAS2. The first connection electrode CNE1 and the second connection electrode CNE2 may be formed on the same layer. The first connection electrode CNE1 and the second connection electrode CNE2 may include the same material. For example, the first connection electrode CNE1 and the second connection electrode CNE2 may be simultaneously formed through a single mask process. Accordingly, since an additional mask process is not required to form the first connection electrode CNE1 and the second connection electrode CNE2, the process efficiency of the display device 10 may be improved.

The first connection electrode CNE1 and the second connection electrode CNE2 may be spaced apart from each other by the second insulating layer PAS2. The first connection electrode CNE1 and the second connection electrode CNE2 may expose at least a portion of the top surface of the second insulating layer PAS2. Although the drawings show that the first connection electrode CNE1 and the second connection electrode CNE2 are disposed on the side surface of the second insulating layer PAS2 and spaced apart on the top surface of the second insulating layer PAS2, the disclosure is not limited thereto. In another example, the first connection electrode CNE1 and the second connection electrode CNE2 may be level with the top surface of the second insulating layer PAS2.

Since the other structures are the same as that of the embodiment of FIG. 6 except that the third insulating layer PAS3 is omitted, redundant description will be omitted.

Hereinafter, other embodiments will be described. In the following embodiments, descriptions of the same components as those described above will be omitted or simplified, and the differences will be mainly described.

Figure 10:
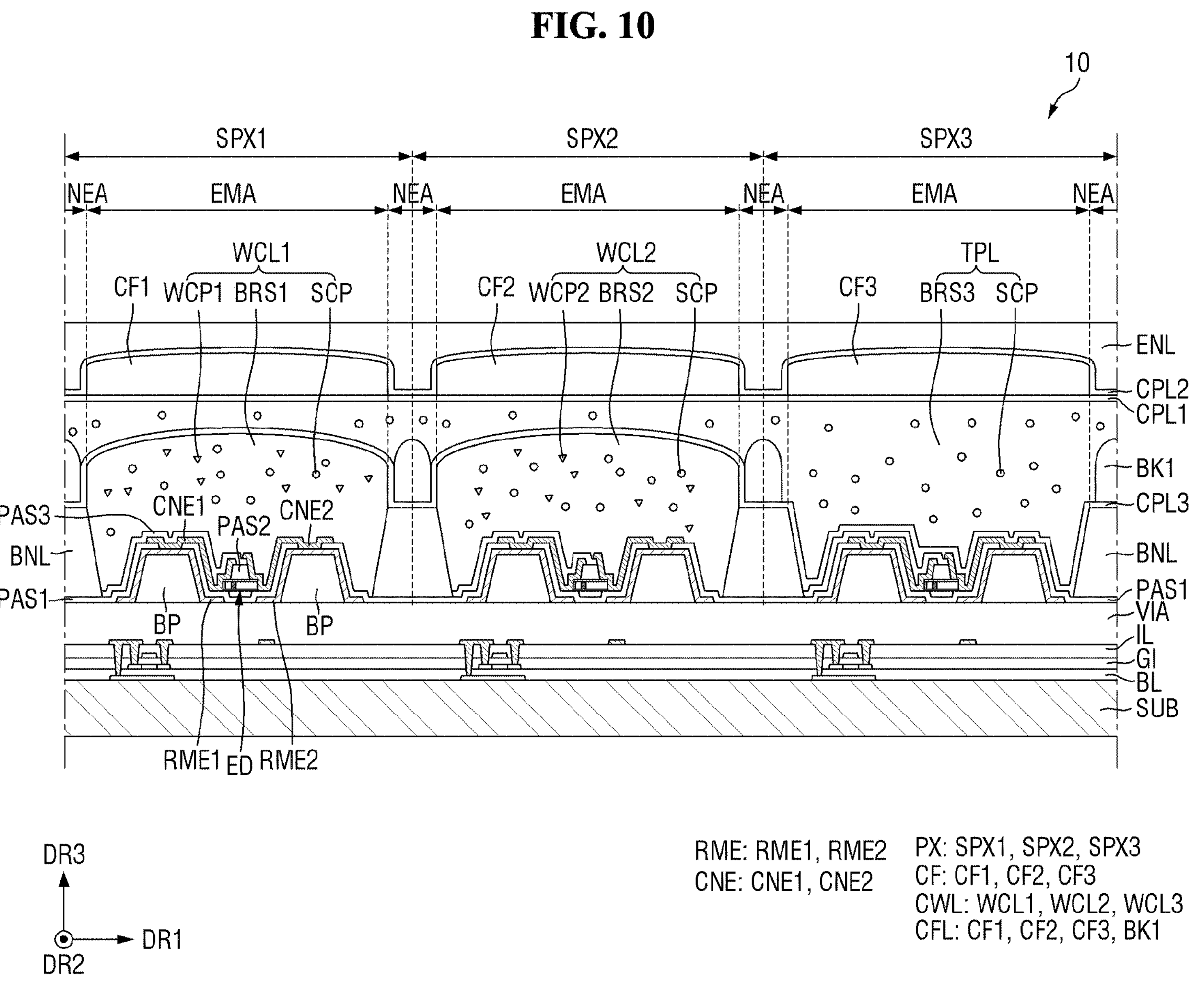
FIG. 10 is a cross-sectional view schematically illustrating a display device according to an embodiment.

FIG. 10 is a cross-sectional view schematically illustrating a display device according to an embodiment.

Referring to FIG. 10, the display device 10 according to the embodiment further is different from the embodiments of FIGS. 2 to 7 described above in that it further includes a third capping layer CPL3 covering the first wavelength conversion layer WCL1 and the second wavelength conversion layer WCL2, and the first light blocking member BK1 is disposed on the third capping layer CPL3.

The third capping layer CPL3 may be disposed between the light transmitting layer TPL and the first and second wavelength conversion layers WCL1 and WCL2. The third capping layer CPL3 may be disposed in the entire display area DA (refer to FIG. 1) of the display device 10. The third capping layer CPL3 may cover entirely the first to third sub-pixels SPX1, SPX2 and SPX3, and may be disposed on the entire emission area EMA and the entire non-emission area NEA.

The third capping layer CPL3 may be disposed between the first wavelength conversion layer WCL1 and the light transmitting layer TPL in the first sub-pixel SPX1, and may directly contact the first wavelength conversion layer WCL1 and the light transmitting layer TPL. The third capping layer CPL3 may cover the bank BNL that separates the emission area EMA and the non-emission area NEA, and may directly contact the top surface of the bank BNL. In the second sub-pixel SPX2, the third capping layer CPL3 may be disposed between the second wavelength conversion layer WCL2 and the light transmitting layer TPL, and may directly contact the second wavelength conversion layer WCL2 and the light transmitting layer TPL. In the third sub-pixel SPX3, the third capping layer CPL3 may cover the third insulating layer PAS3 and the second connection electrode CNE2 of the light emitting element layer EL while directly contacting them.

The third capping layer CPL3 may cover and protect the first wavelength conversion layer WCL1, the second wavelength conversion layer WCL2, and the light emitting element layer EL. Further, the third capping layer CPL3 makes it possible to form the first light blocking member BK1, to be described below, disposed under the light transmitting layer TPL. The third capping layer CPL3 may be formed of the same material or to have the same structure as the first capping layer CPL1 and/or the second capping layer CPL2 that were described above.

The first light blocking member BK1 may be disposed on the third capping layer CPL3. The first light blocking member BK1 may overlap the bank BNL and be directly disposed on the third capping layer CPL3 and may contact the third capping layer CPL3. The first light blocking member BK1 may be disposed between the third capping layer CPL3 and the light transmitting layer TPL to directly contact the light transmitting layer TPL. The layout of the first light blocking member BK1 in a plan view is the same as that described above, and further descriptions will be omitted.

The first light blocking member BK1 may be disposed adjacent to the light emitting element layer EL and the first and second wavelength conversion layers WCL1 and WCL2 to prevent the light converted in the first and second wavelength conversion layers WCL1 and WCL2 from penetrating into the adjacent sub-pixels SPXn.

Since the first light blocking member BK1 is disposed between the third capping layer CPL3 and the light transmitting layer TPL, the first light blocking member BK1 may be omitted from the color filter layer CFL. For example, the first light blocking member BK1 may not be disposed between the color filters CF1, CF2, and CF3. The color filters CF1, CF2 and CF3 may be spaced apart from each other, and the second capping layer CPL2 disposed on the color filters CF1, CF2 and CF3 may be in direct contact with the first capping layer CPL1.

In the embodiment, by providing the third capping layer CPL3 which directly covers the first and second wavelength conversion layers WCL1 and WCL2 and the light emitting element layer EL, the first and second wavelength conversion layers WCL1 and WCL2 and the light emitting element layer EL may be prevented from being deteriorated by external moisture and oxygen. Color mixing may be prevented by disposing the first light blocking member BK1 on the third capping layer CPL3.

Figure 11:
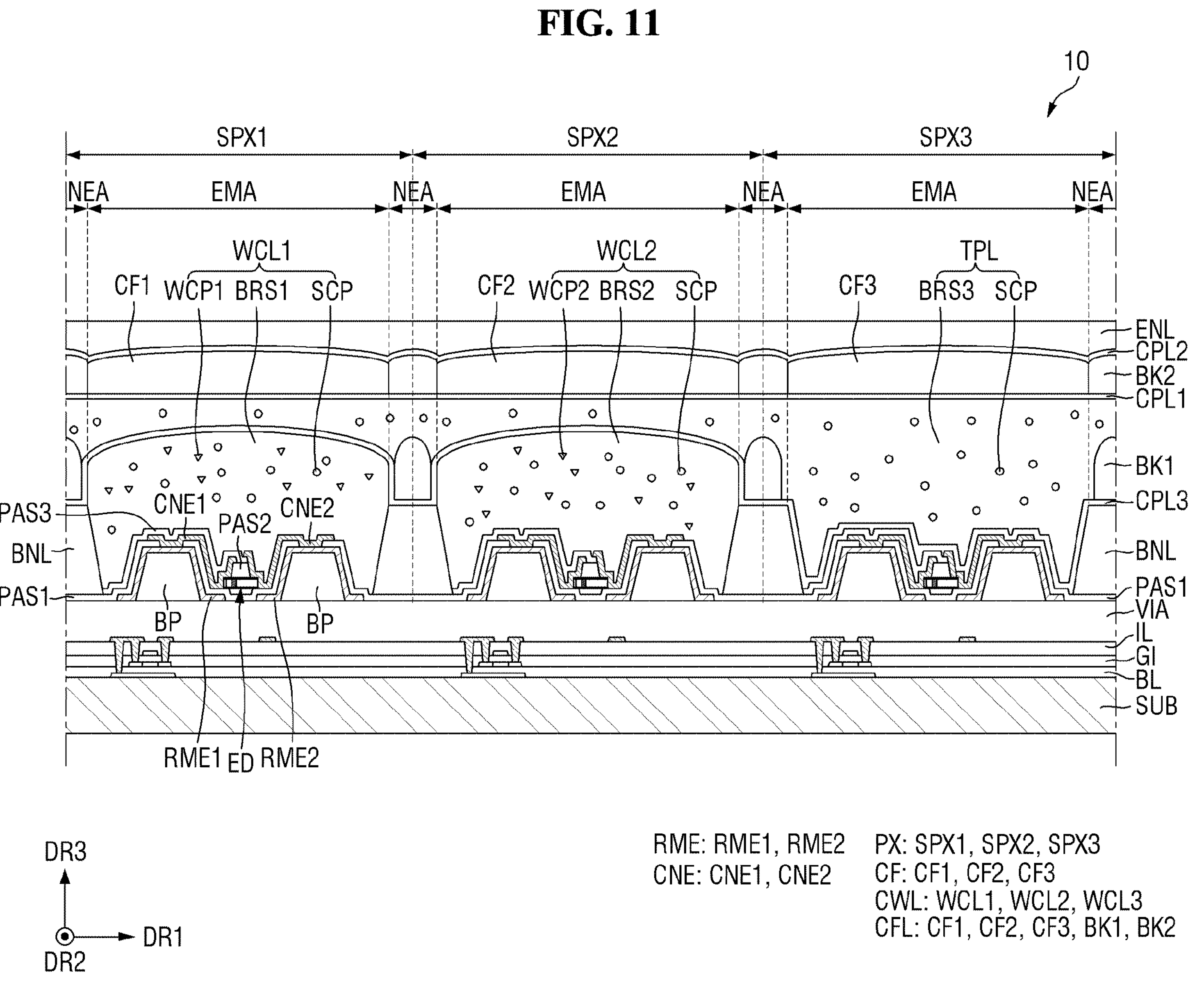
FIG. 11 is a cross-sectional view schematically illustrating a display device according to an embodiment.

FIG. 11 is a cross-sectional view schematically illustrating a display device according to an embodiment.

Referring to FIG. 11, the display device 10 according to the embodiment is different from the above-described embodiment of FIG. 10 in that a second light blocking member BK2 is further included in the color filter layer CFL.

The second light blocking member BK2 may be disposed between the first capping layer CPL1 and the second capping layer CPL2. The second light blocking member BK2 may be disposed between the color filters CF1, CF2 and CF3. The second light blocking member BK2 may overlap the first light blocking member BK1, and may have the same shape as that of the first light blocking member BK1 of FIG. 3 in a plan view. In one embodiment, the width of the second light blocking member BK2 may be larger than the width of the first light blocking member BK1. However, the disclosure is not limited thereto, and the widths of the second light blocking member BK2 and the first light blocking member BK1 may be the equal.

In the embodiment, since the second light blocking member BK2 is included in addition to the first light blocking member BK1, reflection of the external light may be prevented and color mixing between the adjacent sub-pixels SPXn may be further suppressed.

Figure 12:
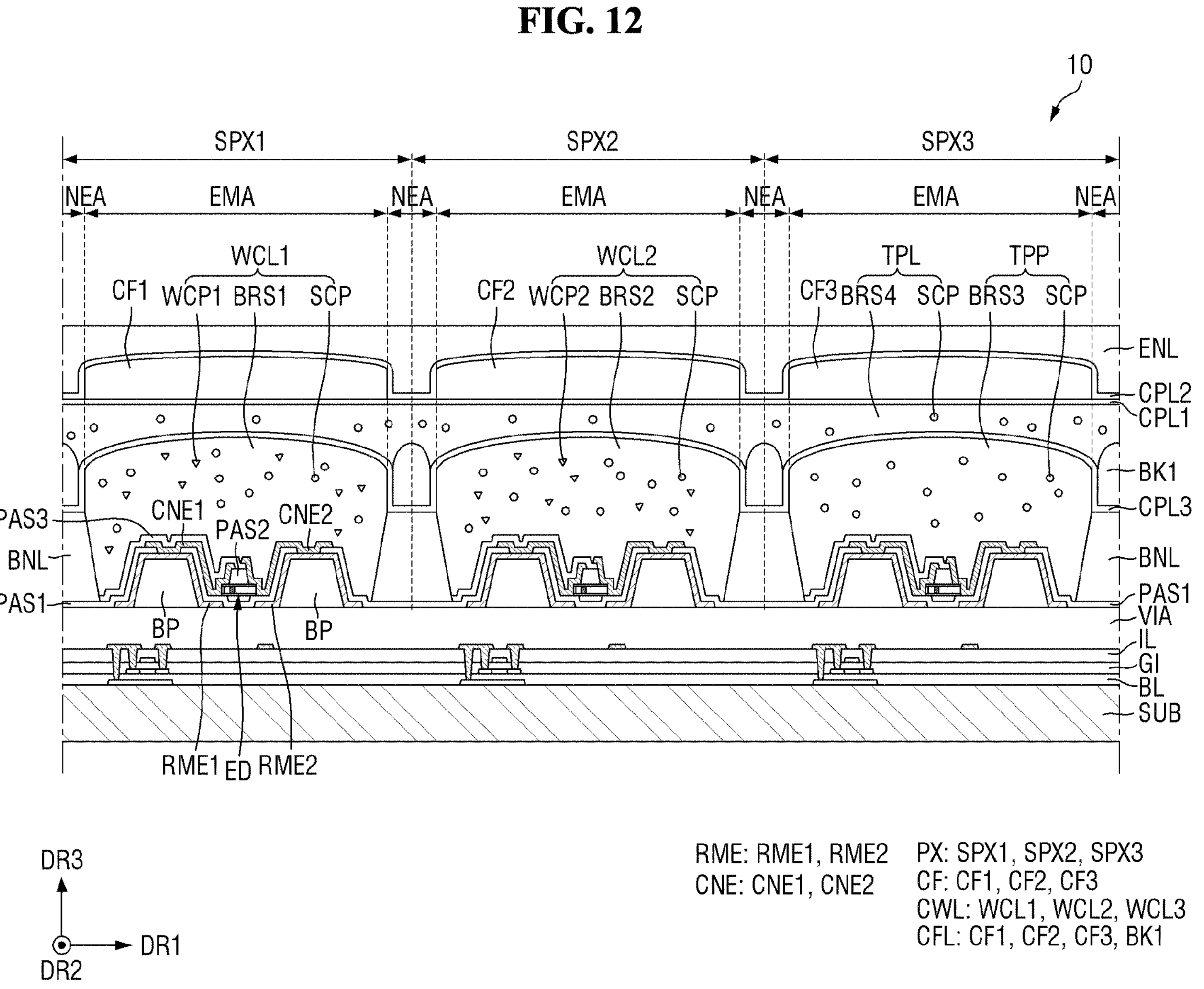
FIG. 12 is a cross-sectional view schematically illustrating a display device according to an embodiment.

FIG. 12 is a cross-sectional view schematically illustrating a display device according to an embodiment.

Referring to FIG. 12, the display device 10 according to the embodiment is different from the embodiment of FIG. 10 in that a light transmitting pattern TPP is disposed in the third sub-pixel SPX3, and the light transmitting layer TPL is disposed on the first wavelength conversion layer WCL1, the second wavelength conversion layer WCL2 and the light transmitting pattern TPP.

The light transmitting pattern TPP may be disposed in the emission area EMA of the third sub-pixel SPX3. The light transmitting pattern TPP may be directly disposed on the third insulating layer PAS3 and the second connection electrode CNE2 to directly contact the third insulating layer PAS3 and the second connection electrode CNE2. The light transmitting pattern TPP may contact the side surface of the bank BNL that delimits the third sub-pixel SPX3, and may protrude in the third direction DR3 to a height higher than the bank BNL.

The light transmitting pattern TPP may include the third base resin BSR3 and the scatterer SCP disposed in the third base resin BSR3. The light transmitting pattern TPP transmits the light of the first color incident from the light emitting element layer EL while maintaining the wavelength of the light. The scatterer SCP of the light transmitting pattern TPP may control an emission path of the light emitted through the light transmitting pattern TPP. The light transmitting pattern TPP may not include a wavelength conversion material.

The third capping layer CPL3 may be disposed on the first wavelength conversion layer WCL1, the second wavelength conversion layer WCL2 and the light transmitting pattern TPP, and the first light blocking member BK1 overlapping the bank BNL and the non-emission area NEA may be disposed on the third capping layer CPL3.

The light transmitting layer TPL may be disposed on the third capping layer CPL3 and the first light blocking member BK1. The light transmitting layer TPL may be disposed between the third capping layer CPL3 and the first capping layer CPL1, and may be in direct contact with the third capping layer CPL3 and the first capping layer CPL1. The light transmitting layer TPL may be entirely disposed over the first sub-pixel SPX1, the second sub-pixel SPX2, and the third sub-pixel SPX3. Also, the light transmitting layer TPL may overlap the first wavelength conversion layer WCL1, the second wavelength conversion layer WCL2, and the light transmitting pattern TPP. The light transmitting layer TPL may also overlap the first color filter CF1, the second color filter CF2, and the third color filter CF3.

The light transmitting layer TPL includes a fourth base resin BRS4 and a scatterer SCP, which may be substantially the same as the third base resin BRS3 and the scatterer SCP of the light transmitting pattern TPP.

In the embodiment, by forming the first wavelength conversion layer WCL1, the second wavelength conversion layer WCL2 and the light transmitting pattern TPP, and then by disposing the third capping layer CPL3 directly covering them, degradation of the first wavelength conversion layer WCL1, the second wavelength conversion layer WCL2 and the light transmitting pattern TPP due to the external moisture and oxygen may be prevented. By forming the light transmitting layer TPL flat on the first wavelength conversion layer WCL1, the second wavelength conversion layer WCL2 and the light transmission pattern TPP, and then disposing the first capping layer CPL1 on the light transmitting layer TPL, it is possible to further prevent degradation of the first wavelength conversion layer WCL1, the second wavelength conversion layer WCL2 and the light transmitting pattern TPP due to the external moisture and/or oxygen.

Figure 13:
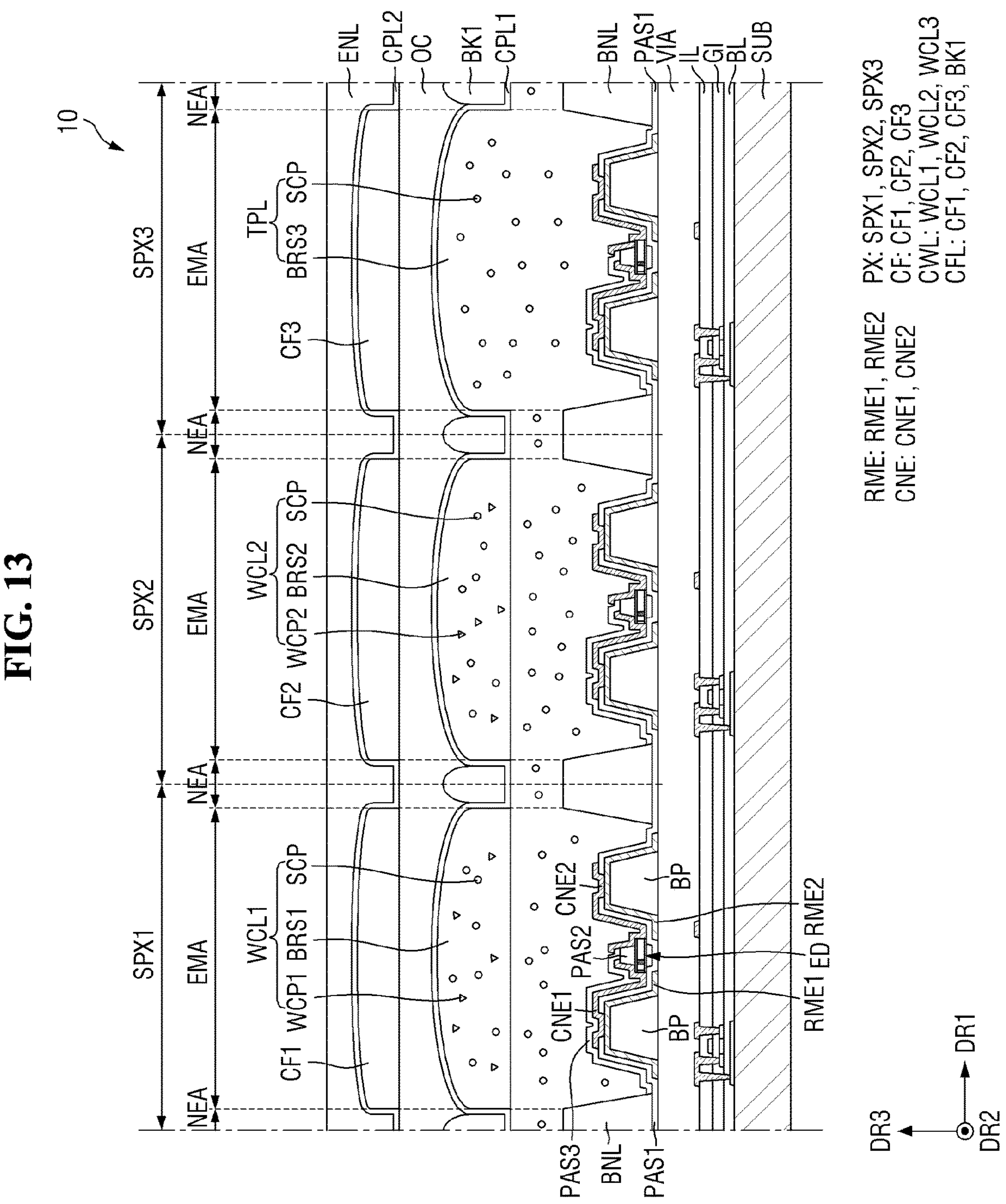
FIG. 13 is a cross-sectional view schematically illustrating a display device according to an embodiment.

FIG. 13 is a cross-sectional view schematically illustrating a display device according to an embodiment.

Referring to FIG. 13, the display device 10 according to the embodiment is different from the embodiment described above in FIG. 7 in that the light transmitting layer TPL is disposed under the first wavelength conversion layer WCL1 and the second wavelength conversion layer WCL2, and the overcoat layer OC is disposed on the first wavelength conversion layer WCL1, the second wavelength conversion layer WCL2, and the light transmitting layer TPL.

The light transmitting layer TPL may be directly disposed on the third insulating layer PAS3 and the second connection electrode CNE2 disposed in each of the first sub-pixel SPX1, the second sub-pixel SPX2, and the third sub-pixel SPX3. The light transmitting layer TPL may be in direct contact with the third insulating layer PAS3 and the second connection electrode CNE2 disposed in each of the first sub-pixel SPX1, the second sub-pixel SPX2, and the third sub-pixel SPX3.

The first wavelength conversion layer WCL1 may be disposed on the light transmitting layer TPL of the first sub-pixel SPX1, and the second wavelength conversion layer WCL2 may be disposed on the light transmitting layer TPL of the second sub-pixel SPX2. For example, the light transmitting layer TPL may be disposed between the light emitting element ED and the first wavelength conversion layer WCL1 and between the light emitting element ED and the second wavelength conversion layer WCL2 to increase the distance between the light emitting element ED and the first wavelength conversion layer WCL1 and the distance between the light emitting element ED and the second wavelength conversion layer WCL2. In an embodiment, the thickness of the light transmitting layer TPL may be in a range of about 3 μm to about 10 μm.

The degree of degradation of the wavelength conversion materials WCP1 and WCP2 respectively included in the first wavelength conversion layer WCL1 and the second wavelength conversion layer WCL2 varies depending on the intensity of the light emitted from the light emitting element ED. The wavelength conversion materials located closest to the light emitting element ED may be degraded earlier, and the wavelength conversion materials farthest to the light emitting element ED may be degraded relatively later.

In the embodiment, by disposing the light transmitting layer TPL between the light emitting element ED and the first and second wavelength conversion layers WCL1 and WCL2, the distance between the light emitting elements ED and the first and second wavelength conversion layers WCL1 and WCL2 is increased. This may alleviate degradation of the wavelength conversion materials WCP1 and WCP2. The light transmitting layer TPL including the scatterer SCP scatters the light emitted from the light emitting element ED to provide a uniform intensity of the light, thus making uniform the degradation rate of the wavelength conversion materials WCP1 and WCP2.

The first capping layer CPL1 may be disposed on the first wavelength conversion layer WCL1, the second wavelength conversion layer WCL2, and the light transmitting layer TPL. On the first capping layer CPL1, the first light blocking member BK1 may be disposed in the non-emission area NEA overlapping the bank BNL in a plan view.

The overcoat layer OC may be disposed on the first light blocking member BK1 and the first capping layer CPL1. The overcoat layer OC may be entirely disposed in the first to third sub-pixels SPX1, SPX2, and SPX3, and may have a flat surface. The overcoat layer OC may planarize the steps formed by the first wavelength conversion layer WCL1, the second wavelength conversion layer WCL2, the light transmitting layer TPL, the first light blocking member BK1, and the first capping layer CPL1, thus facilitating the formation of the color filter layer CFL.

The first color filter CF1, the second color filter CF2, and the third color filter CF3 of the color filter layer CFL may be directly disposed on the overcoat layer OC. At least a portion of the second capping layer CPL2 disposed on the first color filter CF1, the second color filter CF2, and the third color filter CF3 may directly contact the overcoat layer OC. However, the disclosure is not limited thereto, and a capping layer may be further disposed between the overcoat layer OC and the color filters CF.

Figure 14:
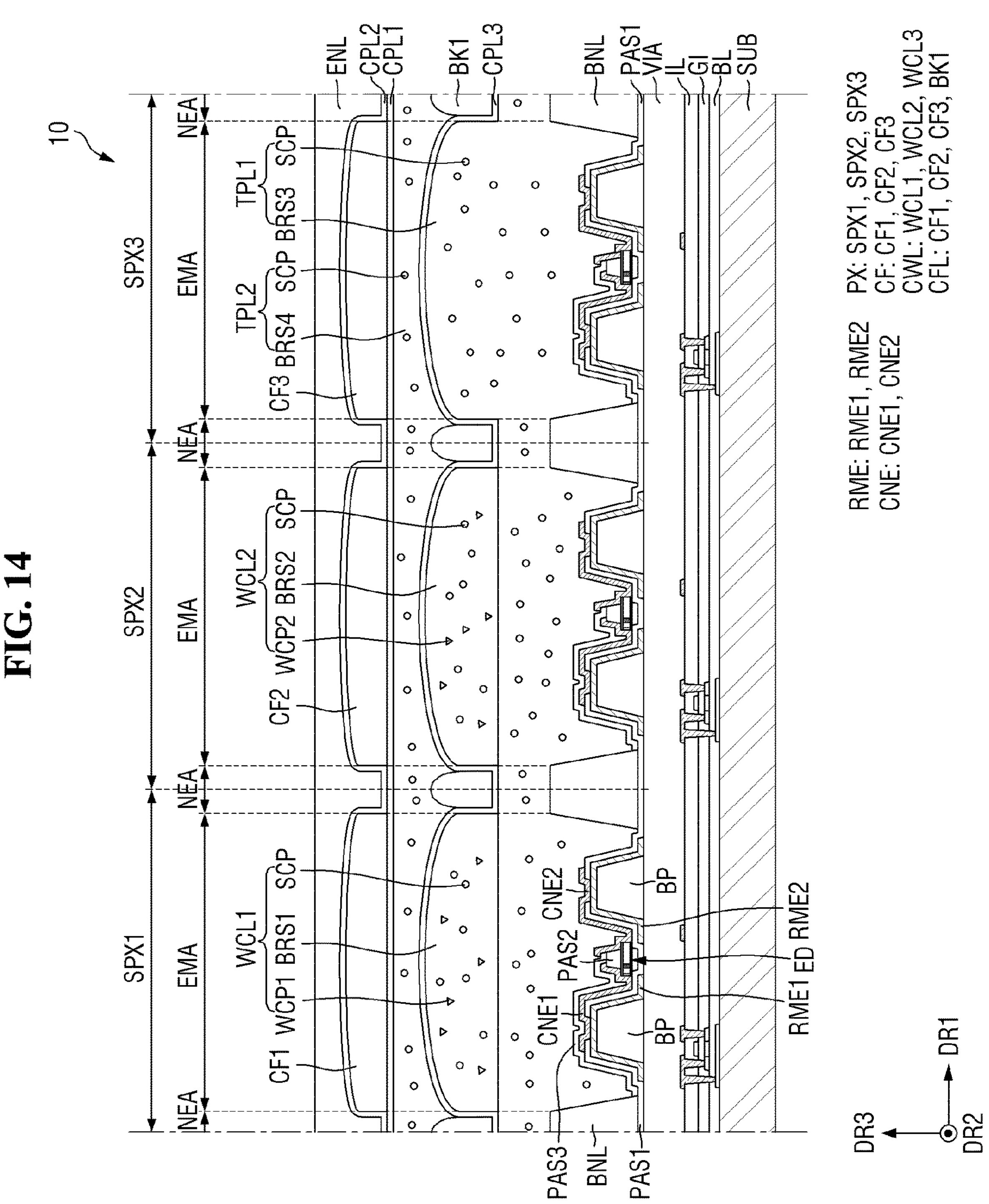
FIG. 14 is a cross-sectional view schematically illustrating a display device according to an embodiment.

FIG. 14 is a cross-sectional view schematically illustrating a display device according to an embodiment.

Referring to FIG. 14, the display device 10 according the embodiment is different from embodiment of FIG. 13 described above in that the first light transmitting layer TPL1 is disposed under the first wavelength conversion layer WCL1 and the second wavelength conversion layer WCL2; a second light transmitting layer TPL2 is disposed on the first wavelength conversion layer WCL1, the second wavelength conversion layer WCL2, and the first light transmitting layer TPL1; and the first capping layer CPL1 is disposed on the second light transmitting layer TPL2.

The first light transmitting layer TPL1 may be directly disposed on the third insulating layer PAS3 and the second connection electrode CNE2 disposed in each of the first sub-pixel SPX1, the second sub-pixel SPX2, and the third sub-pixel SPX3. The first light transmitting layer TPL1 may directly contact the third insulating layer PAS3 and the second connection electrode CNE2 disposed in each of the first sub-pixel SPX1, the second sub-pixel SPX2, and the third sub-pixel SPX3. The first light transmitting layer TPL1 may be disposed between the wavelength conversion layers WCL1 and WCL2 and the light emitting element layer EL.

The first wavelength conversion layer WCL1 and the second wavelength conversion layer WCL2 may be disposed on the first light transmitting layer TPL. The third capping layer CPL3 may be disposed on the first wavelength conversion layer WCL1, the second wavelength conversion layer WCL2, and the first light transmitting layer TPL1. The third capping layer CPL3 may cover the first wavelength conversion layer WCL1, the second wavelength conversion layer WCL2, and the first light transmitting layer TPL1 while contacting them. On the third capping layer CPL3, the first light blocking member BK1 may be disposed in the non-emission area NEA overlapping the bank BNL in a plan view.

The second light transmitting layer TPL2 may be disposed on the first light blocking member BK1 and the third capping layer CPL3. The second light transmitting layer TPL2 may be entirely disposed in the first to third sub-pixels SPX1, SPX2, and SPX3, and may have a flat surface. The second light transmitting layer TPL2 may planarize the steps formed by the first wavelength conversion layer WCL1, the second wavelength conversion layer WCL2, the first light transmitting layer TPL1, the first light blocking member BK1, and the third capping layer CPL3, thus facilitating formation of the first capping layer CPL1 to be described below. For example, since the first capping layer CPL1 is disposed on the flat second light transmitting layer TPL2, the first wavelength conversion layer WCL1 and the second wavelength conversion layer WCL2 may protect the first light transmitting layer TPL1 from external moisture or oxygen. The second light transmitting layer TPL2 may uniformly scatter the light having passed through the first wavelength conversion layer WCL1, the second wavelength conversion layer WCL2 and the first light transmitting layer TPL1, so that a uniform amount of light may be incident to each of the color filters CF1, CF2, and CF3.

The first color filter CF1, the second color filter CF2, and the third color filter CF3 of the color filter layer CFL may be directly disposed on the second light transmitting layer TPL2. Each of the first color filter CF1, the second color filter CF2, and the third color filter CF3 may overlap the first light transmitting layer TPL1 and the second light transmitting layer TPL2 in a plan view. The first color filter CF1 may overlap the first wavelength conversion layer WCL1, and the second color filter CF2 may overlap the second wavelength conversion layer WCL2 in a plan view. At least a portion of the second capping layer CPL2 disposed on the first color filter CF1, the second color filter CF2 and the third color filter CF3 may directly contact the second light transmitting layer TPL2.

Figure 15:
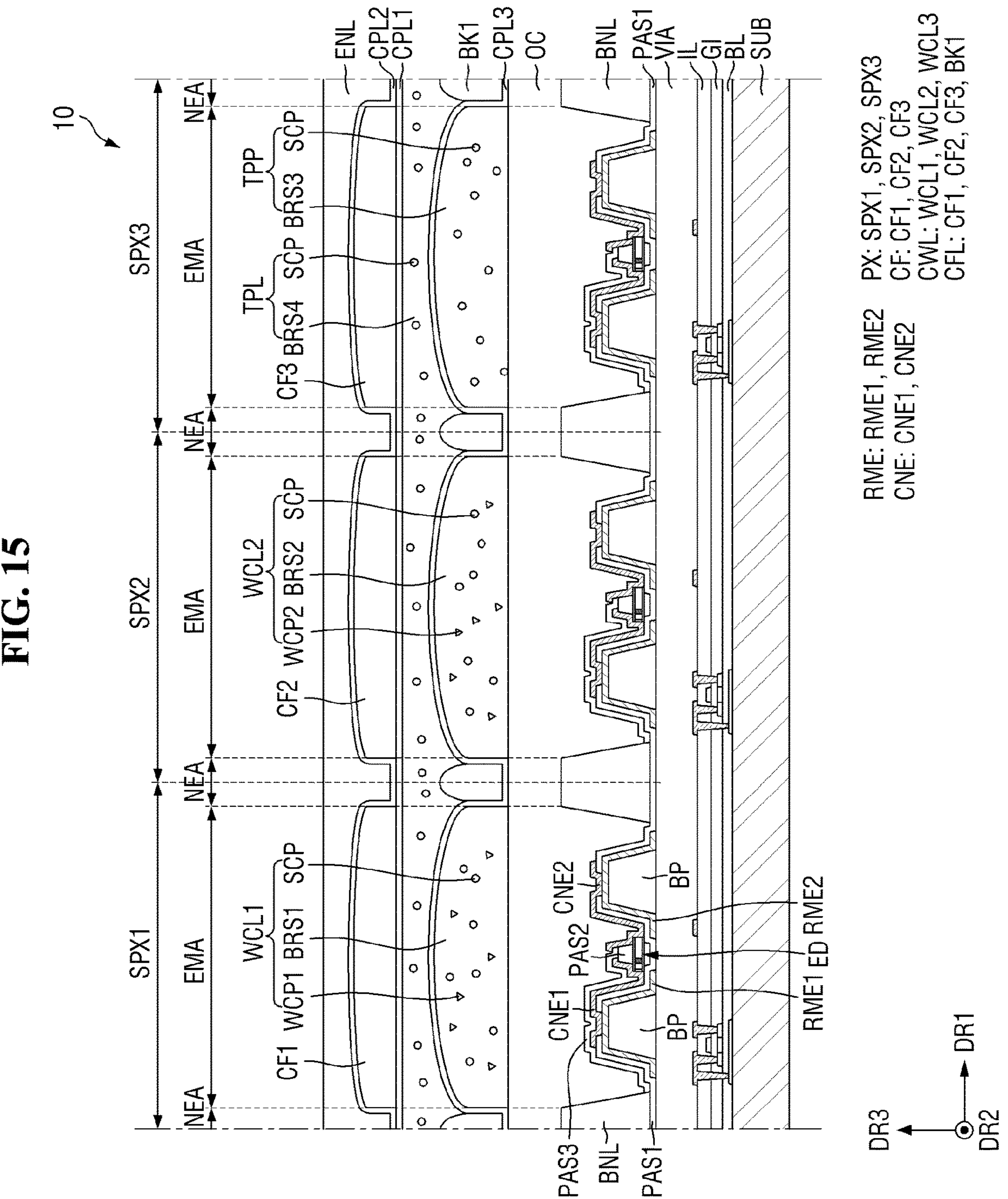
FIG. 15 is a cross-sectional view schematically illustrating a display device according to an embodiment.

FIG. 15 is a cross-sectional view schematically illustrating a display device according to an embodiment.

Referring to FIG. 15, the display device 10 according to the embodiment is different from the embodiment described above in FIG. 12 in that the overcoat layer OC is disposed under the first wavelength conversion layer WCL1, the second wavelength conversion layer WCL2, and the light transmitting pattern TPP.

The overcoat layer OC may be disposed under the first wavelength conversion layer WCL1, the second wavelength conversion layer WCL2, and the light transmitting pattern TPP. The overcoat layer OC may be directly disposed on the third insulating layer PAS3 and the second connection electrode CNE2 disposed in each of the first sub-pixel SPX1, the second sub-pixel SPX2, and the third sub-pixel SPX3. The overcoat layer OC may directly contact the third insulating layer PAS3 and the second connection electrode CNE2 disposed in each of the first sub-pixel SPX1, the second sub-pixel SPX2, and the third sub-pixel SPX3.

The first wavelength conversion layer WCL1 may be disposed on the overcoat layer OC of the first sub-pixel SPX1; the second wavelength conversion layer WCL2 may be disposed on the overcoat layer OC of the second sub-pixel SPX2; and the light transmitting pattern TPP may be disposed on the overcoat layer OC of the third sub-pixel SPX3. The first wavelength conversion layer WCL1, the second wavelength conversion layer WCL2, and the light transmitting pattern TPP may be directly disposed on the overcoat layer OC to be in contact with the overcoat layer OC.

For example, the overcoat layer OC may be disposed between the light emitting element ED and the first wavelength conversion layer WCL1 and between the light emitting element ED and the second wavelength conversion layer WCL2 to increase the distance between the light emitting element ED and the first wavelength conversion layer WCL1 and the distance between the light emitting element ED and the second wavelength conversion layer WCL2. In the embodiment, by disposing the overcoat layer OC between the light emitting element ED and the first and second wavelength conversion layers WCL1 and WCL2, the distance therebetween may be increased to alleviate degradation of the wavelength conversion materials WCP1 and WCP2.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display device comprising:

sub-pixels;

a bank disposed on a substrate and disposed at a boundary between the sub-pixels;

a wavelength control layer including:

wavelength conversion layers disposed in a region surrounded by the bank; and a light transmitting layer disposed in the sub-pixels;

a color filter layer disposed on the wavelength control layer;

a first capping layer disposed between the light transmitting layer and the color filter layer;

a second capping layer disposed on the color filter layer;

a third capping layer; and light emitting element layers disposed between the substrate and the wavelength control layer, the light emitting element layers including:

a light emitting element disposed in one of the sub-pixels;

connection electrodes electrically connected to ends of the light emitting element, wherein each of the wavelength conversion layers contacts at least one of the connection electrodes, wherein the sub-pixels include:

a first sub-pixel;

a second sub-pixel; and a third sub-pixel, and wherein the wavelength conversion layers include:

a first wavelength conversion layer disposed in the first sub-pixel; and a second wavelength conversion layer disposed in the second sub-pixel, wherein the light transmitting layer is disposed on the first wavelength conversion layer in the first sub-pixel, wherein the third capping layer is disposed between the light transmitting layer and the first wavelength conversion layer and disposed between the light transmitting layer and the second wavelength conversion layer, wherein the light transmitting layer is disposed on the second wavelength conversion layer in the second sub-pixel, wherein the light transmitting layer is disposed in the third sub-pixel, wherein at least a portion of the third capping layer contacts at least one of the connection electrodes disposed in the third sub-pixel, and wherein the color filter layer includes color filters, and a first light blocking member disposed between the color filters, and wherein the first light blocking member is disposed between the light transmitting layer and the third capping layer, and overlaps the bank in a plan view.

2. The display device of claim 1, wherein the first wavelength conversion layer contacts at least one of the connection electrodes disposed in the first sub-pixel, the second wavelength conversion layer contacts at least one of the connection electrodes disposed in the second sub-pixel, and the light transmitting layer contacts at least one of the connection electrodes disposed in the third sub-pixel.

3. The display device of claim 1, wherein the color filter layer includes:

a first color filter disposed in the first sub-pixel;

a second color filter disposed in the second sub-pixel; and a third color filter disposed in the third sub-pixel.

4. The display device of claim 3, wherein a light emitted from the light emitting element disposed in the first sub-pixel passes through the first wavelength conversion layer and the light transmitting layer and is incident to the first color filter, a light emitted from the light emitting element disposed in the second sub-pixel passes through the second wavelength conversion layer and the light transmitting layer and is incident to the second color filter, and a light emitted from the light emitting element disposed in the third sub-pixel passes through the light transmitting layer and is incident to the third color filter.

5. The display device of claim 4, wherein the light emitting element disposed in each of the first sub-pixel, the second sub-pixel, and the third sub-pixel emits a first color light, the light incident to the first color filter is converted into a second color light in the first wavelength conversion layer, the light incident to the second color filter is converted into a third color light in the second wavelength conversion layer, and the light incident to the third color filter is the first color light that passes through the light transmitting layer.

6. The display device of claim 3, wherein the first light blocking member is disposed between the first color filter and the second color filter and disposed between the second color filter and the third color filter, and the first light blocking member overlaps the bank in a plan view.

7. The display device of claim 1, wherein the light transmitting layer overlaps the bank in a plan view, and has a top surface that is flat.

8. The display device of claim 1, wherein the first capping layer contacts a top surface of the light transmitting layer.

9. The display device of claim 8, further comprising:

an encapsulation layer disposed on the second capping layer.

10. The display device of claim 1, wherein the color filter layer further includes a second light blocking member disposed between the color filters, and the second light blocking member being disposed between the first capping layer and the second capping layer, and overlapping the first light blocking member in a plan view.

* * * * *